US011038084B2

(12) United States Patent
Hashimoto et al.

(10) Patent No.: US 11,038,084 B2
(45) Date of Patent: Jun. 15, 2021

(54) LIGHT-EMITTING DEVICE

(71) Applicant: NICHIA CORPORATION, Anan (JP)

(72) Inventors: Toru Hashimoto, Tokushima (JP); Takuya Nakabayashi, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/526,263

(22) Filed: Jul. 30, 2019

(65) Prior Publication Data

US 2020/0044115 A1 Feb. 6, 2020

(30) Foreign Application Priority Data

Jul. 31, 2018 (JP) .............................. JP2018-144564

(51) Int. Cl.
*H01L 33/38* (2010.01)
*H01L 33/40* (2010.01)
*H01L 23/00* (2006.01)

(52) U.S. Cl.
CPC .............. *H01L 33/38* (2013.01); *H01L 24/02* (2013.01); *H01L 33/405* (2013.01); *H01L 2924/07802* (2013.01); *H01L 2924/15787* (2013.01); *H01L 2924/15788* (2013.01)

(58) Field of Classification Search
CPC ... H01L 33/486; H01L 33/505; H01L 33/507; H01L 33/60; H01L 33/62; H01L 33/38; H01L 33/405; H01L 24/02
See application file for complete search history.

(56) References Cited

U.S. PATENT DOCUMENTS

| 2007/0126011 | A1 | 6/2007 | Lee |
| 2007/0194340 | A1 | 8/2007 | Akiba et al. |
| 2009/0316384 | A1 | 12/2009 | Kanayama et al. |
| 2010/0090231 | A1* | 4/2010 | Jung .................. H01L 25/0753 257/89 |
| 2011/0222280 | A1* | 9/2011 | Kim ....................... H01L 33/58 362/235 |
| 2012/0098460 | A1 | 4/2012 | Miyasaka et al. |

(Continued)

FOREIGN PATENT DOCUMENTS

| JP | H0715044 A | 1/1995 |
| JP | H07288341 A | 10/1995 |

(Continued)

*Primary Examiner* — Sue A Purvis
*Assistant Examiner* — Scott Stowe
(74) *Attorney, Agent, or Firm* — Hunton Andrews Kurth LLP

(57) ABSTRACT

A light-emitting device includes a first light-emitting element, a second light-emitting element having a peak emission wavelength different from that of the first light-emitting element, a light-guide member covering a light extracting surface and lateral surfaces of the first light-emitting element and a light extracting surface and lateral surfaces of the second light-emitting element, and a wavelength conversion layer continuously covering the light extracting surface of each of the first and second light-emitting elements and disposed apart from each of the first and second light-emitting elements, and a first reflective member covering outer lateral surfaces of the light-guide member. An angle defined by an active layer of the first light-emitting element and an active layer of the second light-emitting element is less than 180° at a wavelength conversion layer side.

20 Claims, 17 Drawing Sheets

(56) References Cited

U.S. PATENT DOCUMENTS

| | | |
|---|---|---|
| 2012/0200786 A1 | 8/2012 | Kamata |
| 2012/0211780 A1 | 8/2012 | Jung et al. |
| 2012/0293721 A1 | 11/2012 | Ueyama |
| 2013/0037842 A1 | 2/2013 | Yamada et al. |
| 2016/0035952 A1 | 2/2016 | Yamada et al. |
| 2018/0123006 A1 | 5/2018 | Yamada et al. |

FOREIGN PATENT DOCUMENTS

| | | |
|---|---|---|
| JP | 2007158296 A | 6/2007 |
| JP | 2007173397 A | 7/2007 |
| JP | 2007184493 A | 7/2007 |
| JP | 2007220925 A | 8/2007 |
| JP | 2009099715 A | 5/2009 |
| JP | 2009266974 A | 11/2009 |
| JP | 2010098313 A | 4/2010 |
| JP | 2010515243 A | 5/2010 |
| JP | 2010283244 A | 12/2010 |
| JP | 2015228512 A | 12/2015 |
| JP | 2016001704 A | 1/2016 |
| WO | 2011004796 A1 | 1/2011 |
| WO | 2011048881 A1 | 4/2011 |
| WO | 2011099328 A1 | 8/2011 |

\* cited by examiner

LIGHT-EMITTING DEVICE

CROSS-REFERENCE TO RELATED APPLICATION

This application claims priority to Japanese Patent Application No. 2018-144564, filed on Jul. 31, 2018, the contents of which are hereby incorporated by reference in their entirety.

BACKGROUND OF THE INVENTION

1. Field of the Invention

The present disclosure relates to a light-emitting device.

2. Description of Related Art

There have been known white light-emitting diodes including a blue light-emitting diode chip and a green light-emitting diode chip mounted on a first lead terminal and sealed by a molding member containing a red phosphor (for example, see Japanese Unexamined Patent Application Publication No. 2007-158296).

SUMMARY OF THE INVENTION

An object of certain embodiments of the present invention is to obtain a light-emitting device in which unevenness in emission color can be reduced.

A light-emitting device according to certain embodiments of the present disclosure includes: a first light-emitting element including a first element light extracting surface, a first element electrode formation surface opposite to the light extracting surface, and first element lateral surfaces between the light extracting surface and the electrode formation surface; a second light-emitting element having a peak emission wavelength different from a peak emission wavelength of the first light-emitting element and including a second element light extracting surface, a second element electrode formation surface opposite to the light extracting surface, and second element lateral surfaces between the light extracting surface and the electrode formation surface and; a light-guide member covering the first element light extracting surface, the first element lateral surfaces, the second element light extracting surface, and the second element lateral surfaces; a wavelength conversion layer continuously covering the first element light extracting surface and the second element light extracting surface and disposed apart from the first light-emitting element and the second light-emitting element such that the light-guide member is disposed between the wavelength conversion layer and each of the first light-emitting element and the second light-emitting element; and a first reflective member covering outer lateral surfaces of the light-guide member. An angle defined by an active layer of the first light-emitting element and an active layer of the second light-emitting element is less than 180° at a wavelength conversion layer side.

With the light-emitting device according to certain embodiments of the present invention, unevenness in emission color of the light-emitting device can be reduced.

DETAILED DESCRIPTION OF EMBODIMENTS

Figure 1A:
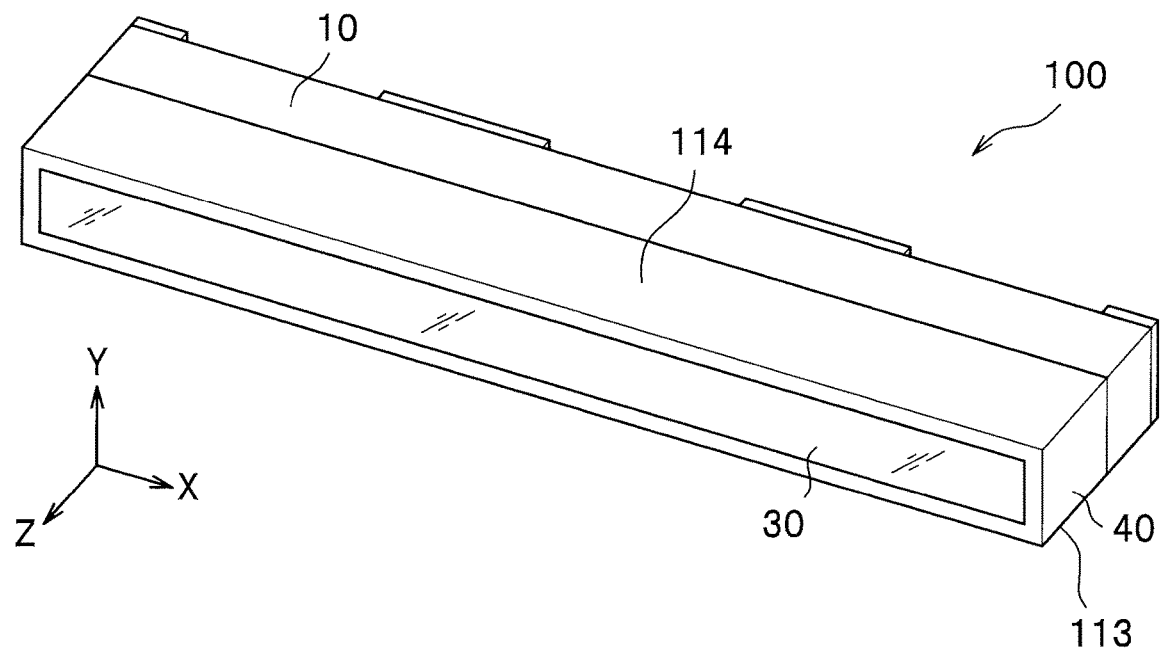
FIG. 1A is a schematic perspective view of a light-emitting device according to a first embodiment of the present disclosure.

The following describes a light-emitting device and a method of manufacturing the light-emitting device according to certain embodiments. The drawings referenced in the descriptions below schematically illustrate certain embodiments. The scales, the distances, the positional relations, and the like of members may be exaggerated, or illustration of some of the members may be omitted. Also, the scales or the distances of the members in a plan view may not be the same as the scales or the distances in a cross-sectional view. In the descriptions below, the same term or reference numeral generally represents the same member or members made of the same material, and its detailed description will be omitted as appropriate. In addition, terms such as "up" and "down" in the present specification are not intended to represent absolute positions but represent relative positions of components.

Structure of Light-Emitting Device

Figure 1B:
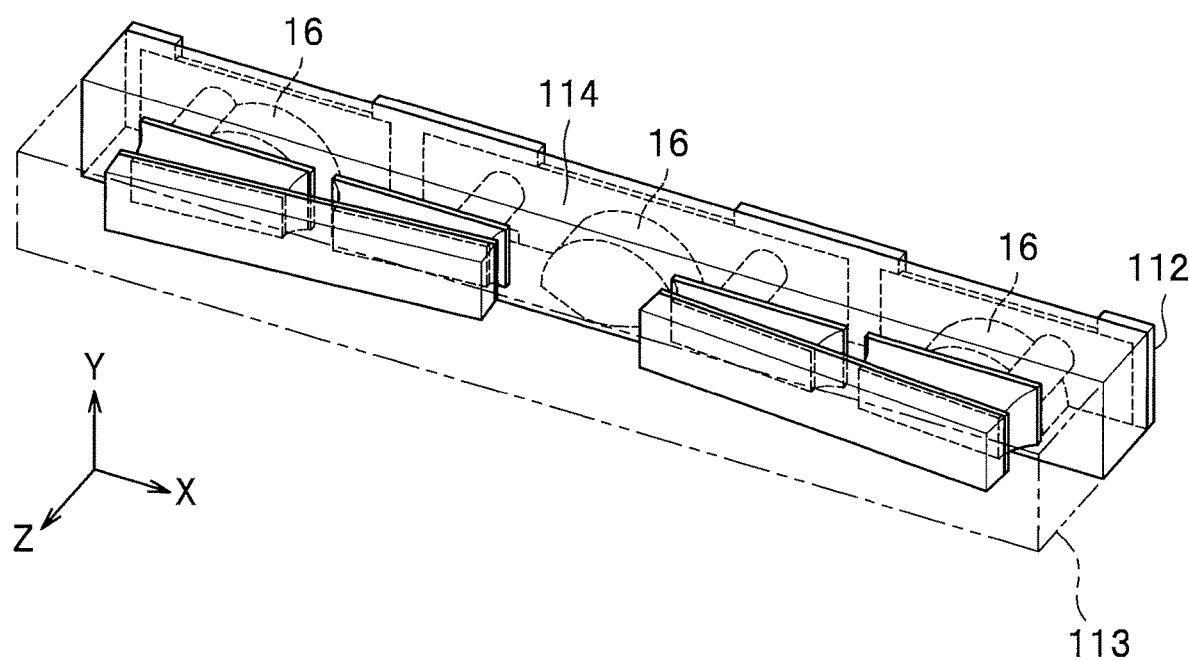
FIG. 1B is a schematic perspective view seen through part of the light-emitting device shown in FIG. 1A.
Figure 1C:
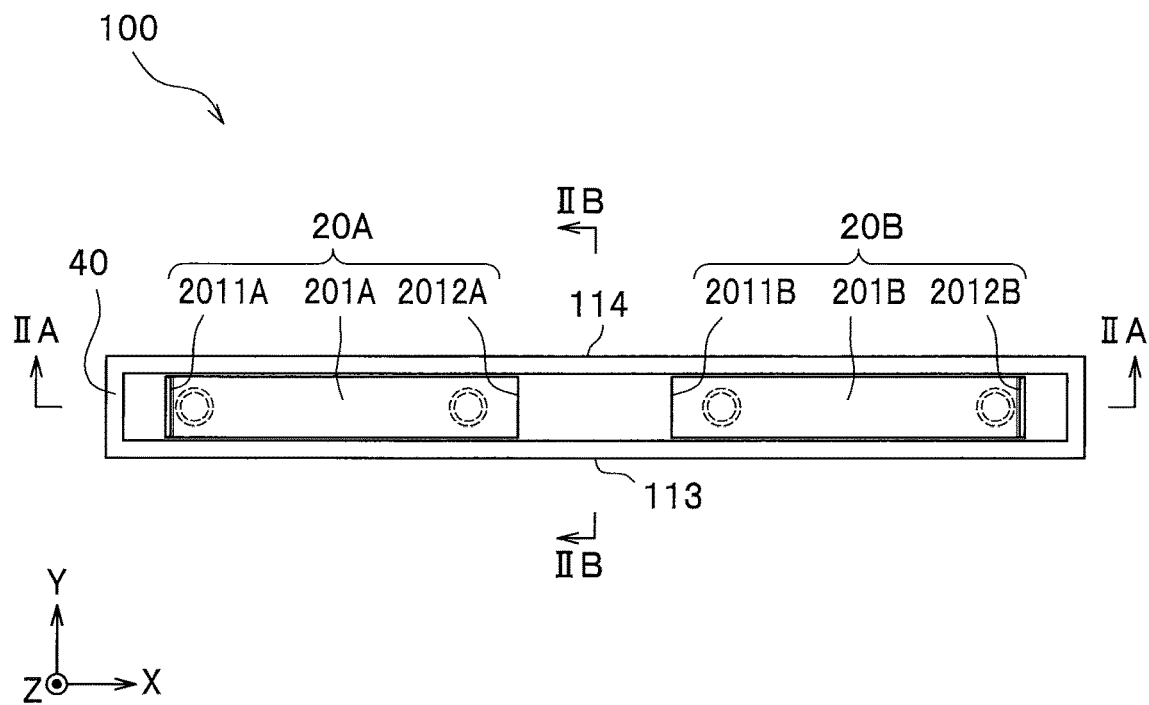
FIG. 1C is a schematic top view of the light-emitting device according to the first embodiment of the present disclosure.
Figure 1D:
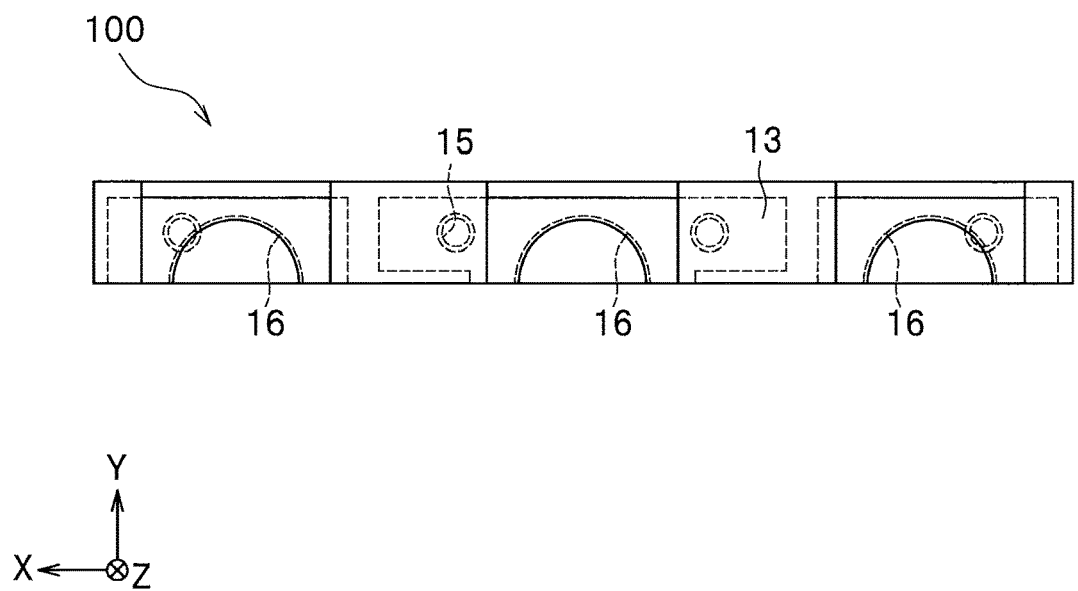
FIG. 1D is a schematic bottom view of the light-emitting device according to the first embodiment of the present disclosure.
Figure 2A:
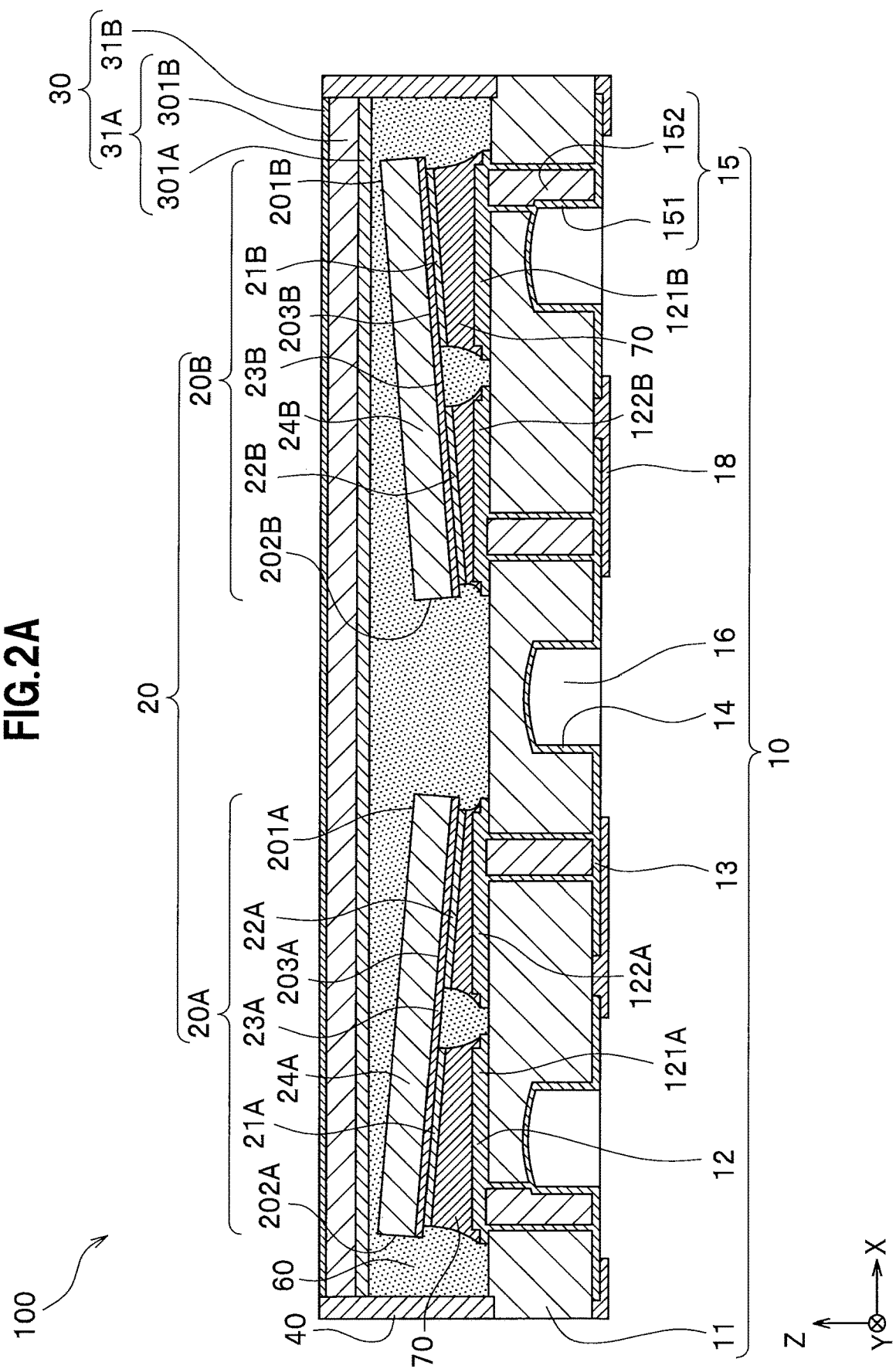
FIG. 2A is a schematic cross-sectional view taken along the line IIA-IIA of FIG. 1C.
Figure 2B:
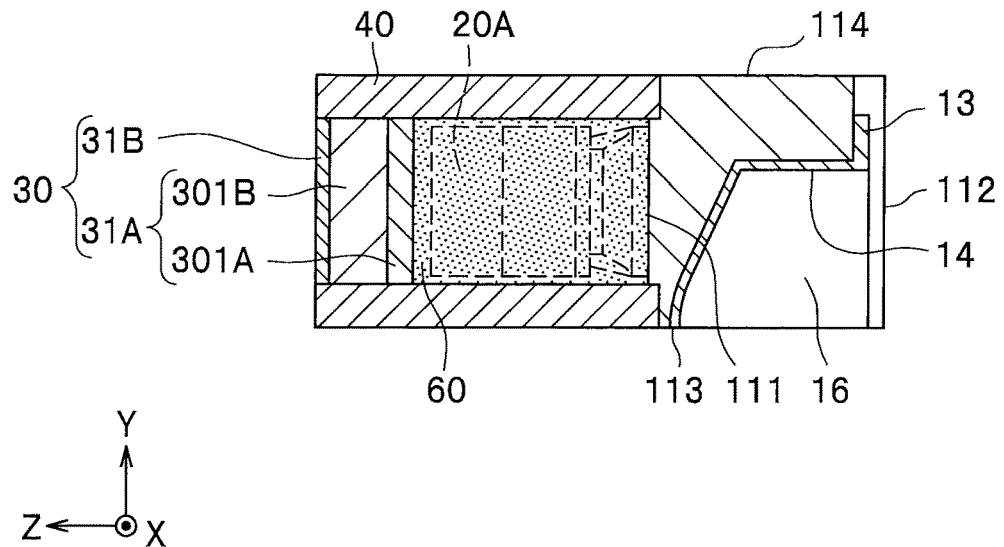
FIG. 2B is a schematic sectional view taken along the line IIB-IIB of FIG. 1C.
Figure 2C:
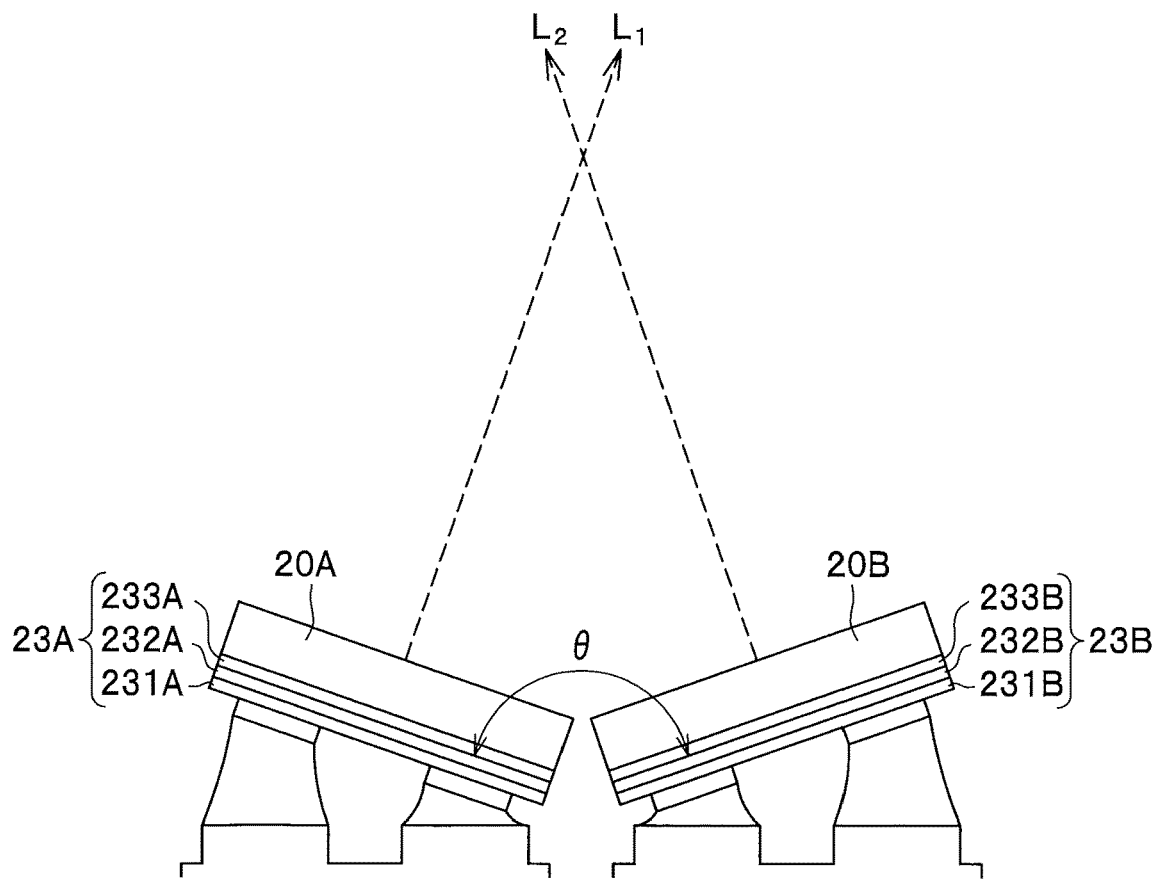
FIG. 2C is a schematic diagram showing the structure and the state of the optical axes of light-emitting elements in the light-emitting device according to the first embodiment of the present disclosure.

The structure of a light-emitting device 100 according to a first embodiment will be described referring to FIG. 1A, FIG. 1B, FIG. 1C, FIG. 1D, FIG. 2A, FIG. 2B, and FIG. 2C. FIG. 1A is a schematic perspective view of the light-emitting device 100 according to the present embodiment. FIG. 1B is a schematic perspective view seen through a portion of the light-emitting device 100 shown in FIG. 1A. FIG. 1C is a schematic top view of the light-emitting device 100 according to the present embodiment. FIG. 1D is a schematic bottom view of the light-emitting device 100 according to the present embodiment. FIG. 2A is a schematic cross-sectional view for illustrating the structure of the light-emitting device 100 according to the present embodiment taken along the line IIA-IIA of FIG. 1C. FIG. 2B is a schematic cross-sectional view for illustrating the structure of the light-emitting device 100 according to the present embodiment taken along the line IIB-IIB of FIG. 1C. FIG. 2C is a schematic diagram showing the structure and the state of the optical axes of light-emitting elements in the light-emitting device 100 according to the present embodiment. The expression "upper surface of the light-emitting device" as used herein refers to a light-emitting surface of the light-emitting device, and an expression "a top view" as used herein refers to a view seen from above the light-emitting surface of the light-emitting device.

The light-emitting device 100 has a rectangular parallelepiped shape having a substantially rectangular shape in a top view along a longitudinal direction (X direction shown in FIG. 1A to FIG. 1D) and a width direction (Y direction shown in FIG. 1A to FIG. 1D) perpendicular to the longitudinal direction, and includes a first light-emitting element 20A, a second light-emitting element 20B, a light-transmissive member 30, a first reflective member 40, and a light-guide member 60.

The light-emitting device 100 includes one or more light-emitting elements. In the description below, a structure of the first light-emitting element 20A will be described as an example of structures of the first light-emitting element 20A and the second light-emitting element 20B.

The first light-emitting element 20A has a first element light extracting surface 201A, a first element electrode formation surface 203A opposite to the first element light extracting surface 201A, and first element lateral surfaces 202A between the first element light extracting surface 201A and the first element electrode formation surface 203A. The first element lateral surface 202A may be perpendicular to the first element light extracting surface 201A or inclined toward another light-emitting element or toward a corresponding outer lateral surface of the light-emitting device 100.

The first element light extracting surface 201A faces an upper surface of the light-emitting device 100, and light emitted from the first element light extracting surface 201A is emitted from the upper surface of the light-emitting device 100.

The first light-emitting element 20A includes a first element substrate 24A, a first element semiconductor layered body 23A in contact with the first element substrate 24A, and a plurality of element electrodes (a first outer electrode 21A and a first inner electrode 22A) in contact with the first element semiconductor layered body 23A. Of the plurality of element electrodes, the first outer electrode 21A is located at an outer side of the light-emitting device 100, and the first inner electrode 22A is located at a central side of the light-emitting device 100. In the present embodiment, the structure in which the first light-emitting element 20A includes the first element substrate 24A is described as an example, but the first light-emitting element 20A may not include the first element substrate 24A.

The first light-emitting element 20A and the second light-emitting element 20B are preferably aligned on a straight line in the longitudinal direction of the light extracting surfaces. A first short side 2011A of the first element light extracting surface 201A of the first light-emitting element 20A faces the first reflective member 40, and a second short side 2012A of the first element light extracting surface 201A faces a first short side 2011B of a second element light extracting surface 201B of the second light-emitting element 20B. The first short side 2011B of the second element light extracting surface 201B faces the first short side 2012A of the first element light extracting surface 201A, and the second short side 2012B of the second element light extracting surface 201B faces the first reflective member 40. With this structure, the first light-emitting element 20A and the second light-emitting element 20B are aligned in the X direction, so that a thickness of the light-emitting device 100 can be reduced in the Y direction.

The first light-emitting element 20A and the second light-emitting element 20B preferably has a rectangular shape, particularly preferably has a square or elongated rectangular shape in a top view from the light-transmissive member 30, but may have another shape. Each of the light-emitting elements 20 preferably has a thickness of 80 μm or greater and 200 μm or less, more preferably 100 μm or greater and 140 μm or less.

The first outer electrode 21A, the first inner electrode 22A, a second outer electrode 21B, and a second inner electrode 22B can be made of a metal such as gold, silver, tin, platinum, rhodium, titanium, aluminum, tungsten, palladium, and nickel or an alloy containing at least one of these metals.

It is preferable that a crystal growth substrate, on which semiconductor crystals constituting the semiconductor layered body can be grown, is mainly used for each of the first element substrate 24A and a second element substrate 24B. Meanwhile, a bonding substrate bonded to the semiconductor element structure that has been separated from the crystal growth substrate may be employed as each of the first element substrate 24A and the second element substrate 24B.

The first element substrate 24A and the second element substrate 24B are preferably transmissive to light. This structure allows for facilitating employment of flip-chip mounting and increasing of the light extraction efficiency of the light-emitting device 100.

Examples of the base materials of the first element substrate 24A and the second element substrate 24B include sapphire, gallium nitride, silicon carbide, and diamond. In particular, sapphire and gallium nitride are preferably used.

The first element semiconductor layered body 23A of the first light-emitting element 20A includes, for example, a p-type semiconductor layer 231A, an active layer 232A, and an n-type semiconductor layer 233A. A second element semiconductor layered body 23B of the second light-emitting element 20B includes, for example, a p-type semiconductor layer 231B, an active layer 232B, and an n-type semiconductor layer 233B.

The first light-emitting element 20A and the second light-emitting element 20B are semiconductor elements that emit light when voltage is applied, and known semiconductor elements containing nitride semiconductors or the like can be applied. Examples of the first light-emitting element 20A and the second light-emitting element 20B include LED chips.

A nitride semiconductor, which can efficiently excite a wavelength conversion substance (wavelength conversion particles) and can emit light with a short wavelength, is preferably used as a semiconductor material for the first light-emitting element 20A and the second light-emitting element 20B. The nitride semiconductor is mainly represented by the general formula $In_xAl_yGa_{1-x-y}N$ (where $0 \leq x$, $0 \leq y$, and $x+y \leq 1$). In addition, InAlGaAs-based semiconductors, InAlGaP semiconductors, zinc sulfide, zinc selenide, silicon carbide, and the like can also be used.

The peak emission wavelength of the first light-emitting element 20A is preferably 430 nm or greater and less than 490 nm (blue wavelength range).

The peak emission wavelength of the second light-emitting element 20B preferably differs from the peak emission wavelength of the first light-emitting element 20A and is preferably 490 nm or greater and less than 570 nm (green wavelength range).

The color reproducibility of the light-emitting device 100 can be improved by specifying the peak emission wavelength of the first light-emitting element 20A and the peak emission wavelength of the second light-emitting element 20B as described above.

The half-width of the second light-emitting element 20B is preferably 5 nm or greater and 40 nm or less. With the half band-width of the second light-emitting element 20B of 5 nm or greater, the light output of the second light-emitting element 20B can be improved. With the half-width of the second light-emitting element 20B of 40 nm or less, a sharp peak of green light can be obtained.

Each of the first light-emitting element 20A and the second light-emitting element 20B is placed above corresponding ones of first wirings 12 of a substrate 10 such that corresponding ones of a plurality of electrically-conductive adhesive members 70 are disposed between each of the first light-emitting element 20A and the second light-emitting element 20B and corresponding ones of first wirings 12, and are therefore placed above the substrate 10. In one example described below, the first light-emitting element 20A is a blue light-emitting element, and the second light-emitting element 20B is a green light-emitting element. The first outer electrode 21A and the first inner electrode 22A disposed on the first element electrode formation surface 203A of the first light-emitting element 20A are bonded to the substrate 10 such that a corresponding one of the plurality of electrically-conductive adhesive members 70 is disposed between the substrate 10 and each of the first outer electrode 21A and the first inner electrode 22A. The second outer electrode 21B and the second inner electrode 22B disposed on the second element electrode formation surface 203B of the second light-emitting element 20B are bonded to the substrate 10 such that a corresponding one of the plurality of electrically-conductive adhesive members 70 is disposed between the substrate 10 and each of the first outer electrode 21A and the first inner electrode 22A.

A portion of the electrically-conductive adhesive member 70 bonded to the first outer electrode 21A is located at a height greater than the height of a portion of the electrically-conductive adhesive member 70 bonded to the first inner electrode 22A. Accordingly, the active layer 232A of the first light-emitting element 20A is inclined toward the center of the light-emitting device 100 relative to a surface on or above which the light-emitting element is placed.

In addition, a portion of the electrically-conductive adhesive member 70 bonded to the second outer electrode 21B may be located at a height greater than the height of a portion of the electrically-conductive adhesive member 70 bonded to the second inner electrode 22B. Accordingly, the active layer 232B of the second light-emitting element 20B is inclined toward the center of the light-emitting device 100 relative to the surface on or above which the light-emitting element is placed.

The expression "toward the center of the light-emitting device 100" refers to a direction toward the center of the light-emitting device 100, which in the present embodiment, refers to a direction toward an intersection of a plane that includes a longitudinal center (for example, X direction shown in FIGS. 1A and 1B), a plane that includes a lateral center (for example, Y direction shown in FIGS. 1A and 1B), and a plane that includes a depth center (for example, Z direction shown in FIGS. 1A and 1B) of the light-emitting device 100.

With this structure, the active layer 232A of the first light-emitting element 20A and the active layer 232B of the second light-emitting element 20B define an angle θ of less than 180° at a wavelength conversion layer 31A side. More specifically, in the light-emitting device 100, the active layer 232A of the first light-emitting element 20A and the active layer 232B of the second light-emitting element 20B are inclined toward the center of the light-emitting device 100 relative to a surface on or above which the light-emitting elements are placed. In one example, as shown in FIG. 2A, in the plane defined by the X direction and the Z direction, the first light-emitting element 20A and the second light-emitting element 20B are inclined such that a height of a position of each of the first light-emitting element 20A and the second light-emitting element 20B is varied in the Z direction. With this structure, an optical axis $L_1$ of the first light-emitting element 20A intersects an optical axis $L_2$ of the second light-emitting element 20B at a light-emitting surface side of the light-emitting device 100 as shown in FIG. 2C.

The angle θ between the active layer 232A of the first light-emitting element 20A and the active layer 232B of the second light-emitting element 20B at the wavelength conversion layer 31A side is preferably 170° or greater and 179.8° or less. With the angle θ of 170° or greater, light emitted from the first light-emitting element 20A and the second light-emitting element 20B is unlikely to be blocked, and the effect of reducing the color unevenness is further enhanced. On the other hand, with the angle θ of 179.8° or less, the height of the light-emitting device can be kept low, so that the light-emitting device 100 can be miniaturized. The angle θ is more preferably 175° or greater in view of further improvement in the effect above, and is more preferably 179° or less in view of miniaturization of the light-emitting device 100.

Adjustment of the angle θ can be performed by adjusting the heights of the electrically-conductive adhesive members 70.

The light-transmissive member 30 continuously covers the first element light extracting surface 201A and the second element light extracting surface 201B apart from the first light-emitting element 20A and the second light-emitting element 20B such that the light-guide member 60 is disposed between the light-transmissive member 30 and each of the first element light extracting surface 201A and the second element light extracting surface 201B.

The light-transmissive member 30 includes a wavelength conversion layer 31A facing the first element light extracting surface 201A and the second element light extracting surface 201B, and a first light-transmissive layer 31B disposed on the wavelength conversion layer 31A. The wavelength conversion layer 31A and the first light-transmissive layer 31B are layered in a layered structure.

The wavelength conversion layer 31A may be constituted of a single layer or a plurality of layers containing different wavelength conversion substances. For example, as in the light-emitting device 100 shown in FIG. 2A, the wavelength conversion layer 31A may include a first wavelength conversion layer 301A and a second wavelength conversion layer 301B disposed on the first wavelength conversion layer 301A.

In this case, the wavelength conversion layer 31A continuously covers the first element light extracting surface 201A and the second element light extracting surface 201B apart from the first light-emitting element 20A and the second light-emitting element 20B such that the light-guide member 60 is disposed between the wavelength conversion layer 31A and each of the first element light extracting surface 201A and the second element light extracting surface 201B.

A base material of the wavelength conversion layer 31A and a base material of the first light-transmissive layer 31B are preferably the same resin material. With the base material of the wavelength conversion layer 31A and the base material of the first light-transmissive layer 31B made of the same resin material, difference in refractive index can be reduced. This structure allows for reducing reflection of light emitted from each light-emitting element at the interface between the wavelength conversion layer 31A and the first light-transmissive layer 31B, so that the light extraction efficiency of the light-emitting device 100 can be increased.

The base material of the light-transmissive member 30 is a material that is transmissive to light emitted from the first light-emitting element 20A and the second light-emitting element 20B. In the present specification, the term "transmissive" refers to that the light transmittance at the peak emission wavelength of each light-emitting element is preferably 60% or greater, more preferably 70% or greater, further preferably 80% or greater.

Examples of the base material of the light-transmissive member 30 include a silicone resin, an epoxy resin, a phenolic resin, a polycarbonate resin, an acrylic resin, a modified resin of these resins, and glass. A silicone resin or a modified silicone resin, which has good heat and light resistance, is particularly preferably used for the base material of the light-transmissive member 30. Specific examples of the silicone resins include dimethyl silicone resins, phenyl-methyl silicone resins, and diphenyl silicone resins. The term "modified resin" in the present specification includes hybrid resin.

The wavelength conversion layer 31A preferably contains the base material and the wavelength conversion substance. The wavelength conversion substance absorbs at least part of light (primary light) emitted from the first light-emitting element 20A and light (primary light) emitted from the second light-emitting element 20B to emit secondary light that has a wavelength different from a wavelength of the primary light. For the wavelength conversion substance, among specific examples of materials described below, one material can be used singly, or two or more materials can be used in combination. The content of the wavelength conversion substance is preferably 50 parts by mass or more and 280 parts by mass or less relative to 100 parts by mass of the base material. The thickness of the wavelength conversion layer 31A is preferably 30 μm or greater and 150 μm or less, and the thickness of the first light-transmissive layer 31B is preferably 10 μm or greater and 50 μm or less.

Examples of wavelength conversion substances that emit green light include yttrium-aluminum-garnet based phosphors (for example, $Y_3(Al,Ga)_5O_{12}$:Ce), lutetium-aluminum-garnet based phosphors (for example, $Lu_3(Al,Ga)_5O_{12}$:Ce), terbium-aluminum-garnet based phosphors (for example, $Tb_3(Al,Ga)_5O_{12}$:Ce), silicate based phosphors (for example, $(Ba,Sr)_2SiO_4$:Eu), chlorosilicate based phosphors (for example, $Ca_8Mg(SiO_4)_4Cl_2$:Eu), β-SiAlON based phosphors (for example, $Si_{6-z}Al_zO_zN_{8-z}$:Eu (0<z<4.2)), SGS based phosphors (for example, $SrGa_2S_4$:Eu), and alkaline earth aluminate based phosphors $(Ba,Sr,Ca)Mg_xAl_{10}O_{16+x}$:Eu, Mn (where 0≤x≤1).

Examples of wavelength conversion substances that emit yellow light include α-SiAlON based phosphors (for example, $M_z(Si,Al)_{12}(O,N)_{16}$ (where 0<z≤2, and M is Li, Mg, Ca, Y, or a lanthanoid element except for La and Ce)). Some of the wavelength conversion substances that emit green light described above also emit yellow light. For example, substituting part of Y in an yttrium-aluminum-garnet based phosphor with Gd allows for shifting a peak emission wavelength thereof to a longer wavelength, which allows yellow light emission. Some of these wavelength conversion substances is adapted to also emit orange light.

Examples of wavelength conversion substances that emit red light include nitrogen-containing calcium aluminosilicate (CASN or SCASN) based phosphors (for example, $(Sr,Ca)AlSiN_3$:Eu). The examples of wavelength conversion substances that emit red light also include manganese-activated fluoride based phosphors (phosphors represented by the general formula (I) $A_2[M_{1-a}Mn_aF_6]$ (in the general formula (I), the symbol "A" is at least one selected from the group consisting of K, Li, Na, Rb, Cs, and $NH_4$, M is at least one element selected from the group consisting of the Group IV elements and the Group XIV elements, and the symbol "a" satisfies 0<a<0.2)). More specific examples of the manganese-activated fluoride-based phosphors include manganese-activated potassium fluorosilicate phosphors (for example, $K_2SiF_6$:Mn).

For example, in the case where the peak emission wavelength of the first light-emitting element 20A is 430 nm or greater and less than 490 nm (blue wavelength range) and the peak emission wavelength of the second light-emitting element 20B is 490 nm or greater and less than 570 nm (green wavelength range), the peak emission wavelength of the wavelength conversion substance preferably is 580 nm or greater and less than 680 nm (red wavelength range). This constitution allows for improving the color reproducibility of the light-emitting device 100.

In the case where the wavelength conversion layer 31A includes the first wavelength conversion layer 301A and the second wavelength conversion layer 301B, the first wavelength conversion layer 301A and the second wavelength conversion layer 301B may contain different wavelength conversion substances. In the descriptions below, the wavelength conversion substances are assumed to be phosphors.

For example, one of the first wavelength conversion layer 301A and the second wavelength conversion layer 301B can be a layer containing a β-SiAlON phosphor, and the other of the first wavelength conversion layer 301A and the second wavelength conversion layer 301B can be a layer containing another wavelength conversion substance such as a manganese-activated potassium fluorosilicate phosphor.

More specifically, examples of the wavelength conversion substance contained in the first wavelength conversion layer 301A include β-SiAlON phosphors, and examples of the wavelength conversion substance contained in the second wavelength conversion layer 301B include manganese-activated potassium fluorosilicate phosphors.

In particular, when a manganese-activated potassium fluorosilicate phosphor is used for the wavelength conversion substance contained in the second wavelength conversion layer 301B, it is preferable that the light-transmissive member 30 include the first wavelength conversion layer 301A and the second wavelength conversion layer 301B. A manganese-activated potassium fluorosilicate phosphor easily reaches luminance saturation, but the arrangement in which the first wavelength conversion layer 301A is located between the second wavelength conversion layer 301B and each light-emitting element allows for preventing the manganese-activated potassium fluorosilicate phosphor from being excessively irradiated with light emitted from each light-emitting element. This allows for reducing deterioration of the manganese-activated potassium fluorosilicate phosphor.

The wavelength conversion layer 31A includes two layers in the example described above, but the wavelength conversion layer 31A may include three or more layers containing different wavelength conversion substances. Light-transmissive layer(s) containing no wavelength conversion substance may be disposed between a plurality of wavelength conversion layers.

Further, each wavelength conversion layer contains one wavelength conversion substance in the example described above, but any another appropriate structure may be employed, and two or more wavelength conversion substances may be mixed.

The wavelength conversion layer 31A may further contain diffusing particles. With the light-transmissive member 30 including the wavelength conversion layer 31A containing the diffusing particles, diffusion of light emitted from each light-emitting element and light emitted from the wavelength conversion substances excited by light emitted from each light-emitting element can be facilitated, so that amounts of the wavelength conversion substances can be reduced. The particle diameter of the diffusing particles is, for example, preferably approximately 0.1 μm or greater and 3 μm or less.

The first light-transmissive layer 31B preferably contains a base material and first diffusing particles. With the light-transmissive member 30 including the first light-transmissive layer 31B containing the first diffusing particles, light emitted from the first light-emitting element 20A and light emitted from the second light-emitting element 20B can be efficiently mixed with light emitted from the wavelength conversion substance excited by light emitted from the first light-emitting element 20A and the second light-emitting element 20B in the first light-transmissive layer 31B. Unevenness in emission color of the light-emitting device 100 can be thus reduced.

The first light-transmissive layer 31B also functions as a protective layer for the wavelength conversion layer 31A. This structure allows for reducing deterioration of the wavelength conversion layer 31A even in the case where the wavelength conversion layer 31A contains a wavelength conversion substance vulnerable to water (such as a manganese-activated fluoride-based phosphor).

For example, titanium oxide, silicon oxide, aluminum oxide, zirconium oxide, or zinc oxide can be used for the first diffusing particles.

The first reflective member 40 is disposed so as to surround the first light-emitting element 20A, the second light-emitting element 20B, and the light-guide member 60 in a top view (see FIG. 1C). The first reflective member 40 covers the outer lateral surfaces of the light-guide member 60 and the outer lateral surfaces of the light-transmissive member 30.

The first reflective member 40 reflects light traveling in the X direction and/or the Y direction from the first light-emitting element 20A and the second light-emitting element 20B to increase light traveling in the Z direction.

That is, providing the first reflective member 40 can increase light reflected toward the light-transmissive member 30 out of light emitted from the first light-emitting element 20A and second light-emitting element 20B. This structure can enhance the light extraction efficiency of the light-emitting device 100.

The first reflective member 40 preferably covers the lateral surfaces of the wavelength conversion layer 31A and the lateral surfaces of the first light-transmissive layer 31B. This structure allows for obtaining the light-emitting device 100 with high contrast between a light-emitting region and a non-light-emitting region and good visibility.

The lower surface of the first reflective member 40 enters the substrate 10, and is located inward of the substrate 10. This structure allows for reducing leakage of light from the lateral surfaces of the light-emitting device 100.

The light reflectance of the first reflective member 40 at the peak emission wavelength of each light-emitting element is preferably 70% or greater, more preferably 80% or greater, further preferably 90% or greater, in view of the light extraction efficiency in the Z direction. The first reflective member 40 can be formed by, for example, transfer molding, injection molding, compression molding, potting, or printing.

For the base material of the first reflective member 40, a resin such as a silicone resin, an epoxy resin, a phenolic resin, a polycarbonate resin, an acrylic resin, or a modified resin of these resins is preferably used. In particular, a silicone resin or a modified silicone resin, which has good heat and light resistance, is particularly preferably used. Examples of the silicone resins include dimethyl silicone resins, phenyl-methyl silicone resins, and diphenyl silicone resins.

The first reflective member 40 is preferably white in color and preferably contains a white pigment in the base material. For the white pigment, for example, one of titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, zirconium oxide, and silicon oxide can be used singly, or two or more of these materials can be used in combination. The concentration of the white pigment in the first reflective member 40 is preferably 20 mass % or greater, more preferably 50 mass % or greater.

The lateral surfaces of the first reflective member 40 on a lateral surface 113 at a mounting side along the longitudinal direction of the light-emitting device 100 is preferably inclined toward the inside of the light-emitting device 100 in the Z direction. This structure allows for reducing contact of the lateral surface of the first reflective member 40 with the mounting board when the light-emitting device 100 is mounted on or above the mounting board, which facilitates obtaining a stable mounting orientation of the light-emitting device 100. The lateral surface of the first reflective member 40 on a lateral surface 114 opposite to the mounting side along the longitudinal direction of the light-emitting device 100 is preferably inclined toward the inside of the light-emitting device 100 in the Z direction. This structure allows for preventing contact of the lateral surface of the first reflective member 40 with a suction nozzle (collet) during manufacture, so that damage to the first reflective member 40 at the time of suction of the light-emitting device 100 can be prevented.

An inclination angle of the first reflective member 40 can be appropriately selected but is preferably 0.3° or greater and 3° or less, more preferably 0.5° or greater and 2° or less, further preferably 0.7° or greater and 1.5° or less. In the case where the first reflective member 40 includes such inclined lateral surface, the orientation the light-emitting device 100 to emit light is adjusted when the light-emitting device 100 is connected to the substrate to be connected.

The light-guide member 60 covers the first element light extracting surface 201A, the first element lateral surfaces 202A, the second element light extracting surface 201B, and second element lateral surfaces 202B. The light-guide member 60 also bonds the first light-emitting element 20A and the second light-emitting element 20B to the light-transmissive member 30 and guides light emitted from each light-emitting element to the light-transmissive member 30. With the light-guide member 60, light emitted from the first light-emitting element 20A and light emitted from the second light-emitting element 20B can be easily mixed in the light-guide member 60, so that unevenness in emission color of the light-emitting device 100 can be reduced.

The light-guide member 60 preferably contains a wavelength conversion substance in the base material of the light-guide member 60. The wavelength conversion substance used in the light-guide member 60 absorbs at least a portion of light (primary light) emitted from the first light-emitting element 20A and light (primary light) emitted from the second light-emitting element 20B to emit secondary light that differs in wavelength from the primary light. For the wavelength conversion substance used in the light-guide member 60, among specific examples of the wavelength conversion substance used for the wavelength conversion layer 31A described above, one material can be used singly, or two or more materials can be used in combination. The light-guide member 60 may contain no wavelength conversion substance in the base material. The thickness of the light-guide member 60 is preferably 130 µm or greater and 250 µm or less.

The wavelength conversion substance in the base material of the light-guide member 60 is preferably predominantly disposed between the first light-emitting element 20A and the second light-emitting element 20B. With this structure, the wavelength conversion substance is excited by light emitted from the first element lateral surfaces 202A and/or the second element lateral surfaces 202B, so that unevenness in emission color can be reduced.

A resin same as the resin used for the first reflective member 40 can be used for the base material of the light-guide member 60.

The peak emission wavelength of the wavelength conversion substance used in the light-guide member 60 is preferably 580 nm or greater and less than 680 nm, more preferably 515 nm or greater and less than 550 nm. This constitution allows for obtaining an effect of, for example, widening the color gamut of a liquid-crystal display.

Each of the plurality of element electrodes (the first outer electrode 21A and the first inner electrode 22A) disposed on the first light-emitting element 20A with the first wiring 12 and a corresponding one of the first wirings 12 are electrically connected by a corresponding one of the plurality of electrically-conductive adhesive members 70. Similarly, each of the plurality of element electrodes (the second outer electrode 21B and the second inner electrode 22B) disposed on the second light-emitting element 20B and a corresponding one of the first wirings 12 are electrically connected by a corresponding one of the plurality of electrically-conductive adhesive members 70.

For example, bumps of gold, silver, or copper, a metal paste containing a resin binder and powder of a metal such as silver, gold, copper, platinum, aluminum, or palladium, a solder such as a tin-bismuth solder, tin-copper solder, tin-silver solder, or gold-tin solder, or a brazing material such as a low-melting-point metal is preferably used as a material of the plurality of electrically-conductive adhesive members 70.

The substrate 10 includes a support substrate 11, the first wiring 12, second wiring 13, and vias 15 (each including fourth wiring 151 and filler members 152). The support substrate 11 may define one or more recesses 16. In the case where the support substrate 11 defines the recesses 16, the substrate 10 may include third wiring 14 covering the inner walls of recesses 16.

The support substrate 11 has an upper surface 111 extending in the longitudinal direction (X direction shown in FIG. 2B) and the width direction (Y direction shown in FIG. 2B), a bottom surface 112 opposite to the upper surface 111, the lateral surface 113 at the mounting side adjacent and perpendicular to the upper surface 111, and the lateral surface 114 opposite to the mounting side and opposite to the lateral surface 113 at the mounting side.

The support substrate 11 is particularly preferably made of a material having a coefficient of linear expansion of similar to a coefficient of linear expansion of the first light-emitting element 20A and a coefficient of linear expansion of the second light-emitting element 20B. Examples of the material of the support substrate 11 include insulating members such as resins or fiber-reinforced resins, ceramics, and glass.

The lower limit of a thickness of the support substrate 11 is preferably 0.05 mm or greater, more preferably 0.2 mm or greater, in view of the strength. The upper limit of a thickness of the support substrate 11 is preferably 0.5 mm or less, more preferably 0.4 mm or less, in view of the thickness (i.e., depth) of the light-emitting device 100 in the Z direction.

The first wirings 12 are disposed on the upper surface 111 of the support substrate 11, and each of the first wirings 12 is electrically connected to a corresponding one of the first light-emitting element 20A and the second light-emitting element 20B.

Each of the first wirings 12 connected to the first light-emitting element 20A preferably includes a first outer projection 121A overlapping with the first outer electrode 21A of the first light-emitting element 20A in a top view and connected to the first light-emitting element 20A, and includes a first inner projection 122A overlapping with the first inner electrode 22A in a top view and connected to the first light-emitting element 20A. Each of the first wirings 12 connected to the second light-emitting element 20B preferably includes a second outer projection 121B overlapping with the second outer electrode 21B of the second light-emitting element 20B in a top view and connected to the second light-emitting element 20B, and includes a second inner projection 122B overlapping with the second inner electrode 22B in a top view and connected to the second light-emitting element 20B.

With this structure, when each of the first outer electrode 21A and the first inner electrode 22A and a corresponding one of the first wirings 12 are connected via a corresponding one of the plurality of electrically-conductive adhesive members 70, and when each of the second outer electrode 21B and the second inner electrode 22B and a corresponding one of the first wirings 12 are connected via a corresponding one of the plurality of electrically-conductive adhesive members 70, alignment between each light-emitting element and the substrate 10 can be easily performed due to self-alignment effect.

The first outer projection 121A, the first inner projection 122A, the second outer projection 121B, and the second inner projection 122B may have any appropriate shapes, heights, sizes, and the like, and shapes, heights, sizes, and the like thereof are preferably adjusted appropriately according to the size of the substrate 10, the thickness of the first wiring 12, the size of the first light-emitting element 20A, the size of the second light-emitting element 20B, and the like.

The lateral surfaces of the first outer projection 121A, the first inner projection 122A, the second outer projection 121B, and the second inner projection 122B may be inclined or perpendicular with respect to an upper surface of a corresponding one of the wirings 12. With the lateral surfaces of the first outer projection 121A, the first inner projection 122A, the second outer projection 121B, and the second inner projection 122B perpendicular to the upper surface of corresponding ones of the wirings 12, each of the first light-emitting element 20A and the second light-emitting element 20B are easily secured on a corresponding one of the first outer projection 121A, the first inner projection 122A, the second outer projection 121B, and the second inner projection 122B, so that each light-emitting element can be stably mounted.

Each second wiring 13 is disposed on the bottom surface 112 of the support substrate 11 and is electrically connected to a corresponding one of the first wirings 12 through a corresponding one of the vias 15.

Each second wiring 13 may be provided with an insulating film 18 covering part of the second wiring 13. The insulating film 18 is preferably made of a material used in the field of the invention, such as a thermosetting resin and a thermoplastic resin. With the second wirings 13 each provided with the insulating film 18, the insulation at the bottom surface 112 can be more surely obtained, and occurrence of short circuit at the bottom surface 112 can be more surely prevented. Further, with the second wirings 13 each provided with the insulating film 18, detachment of the second wiring 13 from the support substrate 11 can be prevented.

The first wiring 12, the second wiring 13, and the third wiring 14 are preferably made of, for example, copper, iron, nickel, tungsten, chromium, aluminum, silver, gold, titanium, palladium, rhodium, or an alloy containing at least one of these metals. For the first wiring 12, the second wiring 13, and the third wiring 14, a single layer of one of these metals or an alloy of one or more of these metals may be used, or a layered structure of one or more of these metals and/or an alloy of one or more of these metals may be used.

The vias 15 are disposed in through-holes extending through the upper surface 111 of the support substrate 11 and the bottom surface 112 of the support substrate 11 and electrically connect the first wiring 12 and the second wiring 13. Each of the vias 15 includes the fourth wiring 151 covering the surface of the through-hole formed in the Z direction and the filler member 152 disposed inside the fourth wiring 151.

The substrate 10 may not have the vias 15.

The fourth wiring 151 is preferably made of an electrically-conductive material substantially same as the material of the first wiring 12, the second wiring 13, and the third wiring 14. Examples of the material include copper, iron, nickel, tungsten, chromium, aluminum, silver, gold, titanium, palladium, rhodium, or an alloy containing at least one of these metals.

The filler members 152 may be made of an electrically-conductive material used for each wiring described above. For example, an insulating material such as an epoxy resin may be employed for the filler members 152.

The recesses 16 preferably have substantially semicircular opening shapes on the bottom surface 112 (see FIG. 1D). With the openings of the recesses 16 each having a shape without corners on the bottom surface 112, stress concentrated at the recesses 16 can be reduced, so that breakage of the support substrate 11 can be reduced.

Each recess 16 may have the same depth at the lateral surface 113 on the mounting side and at the lateral surface 114 opposite to the mounting side, or may have different depths at the lateral surface 113 on the mounting side and at the lateral surface 114 opposite to the mounting side.

The substrate 10 may not define the recesses 16, but the substrate 10 defining the recesses 16 allows for facilitating fixing of the light-emitting device 100 to the mounting board via bonding members such as solder formed in the recesses 16, so that the bonding strength between the light-emitting device 100 and the mounting board can be increased.

As described above, in the light-emitting device 100 according to the present embodiment, the angle θ defined by the active layer 232A of the first light-emitting element 20A and the active layer 232B of the second light-emitting element 20B is less than 180° at the wavelength conversion layer 31A side. In this structure, the light-emitting elements are not shaded with each other, and light emitted from the first light-emitting element 20A and the second light-emitting element 20B is not blocked. The light-emitting device 100 in which unevenness in emission color is reduced can be thus obtained.

MODIFIED EXAMPLES

Subsequently, modified examples of the light-emitting device 100 according to the present embodiment are described referring to FIG. 3 to FIG. 10. In each modified example, duplicative descriptions of the same structure as in the first embodiment described above may be omitted.

First Modified Example

Figure 3:
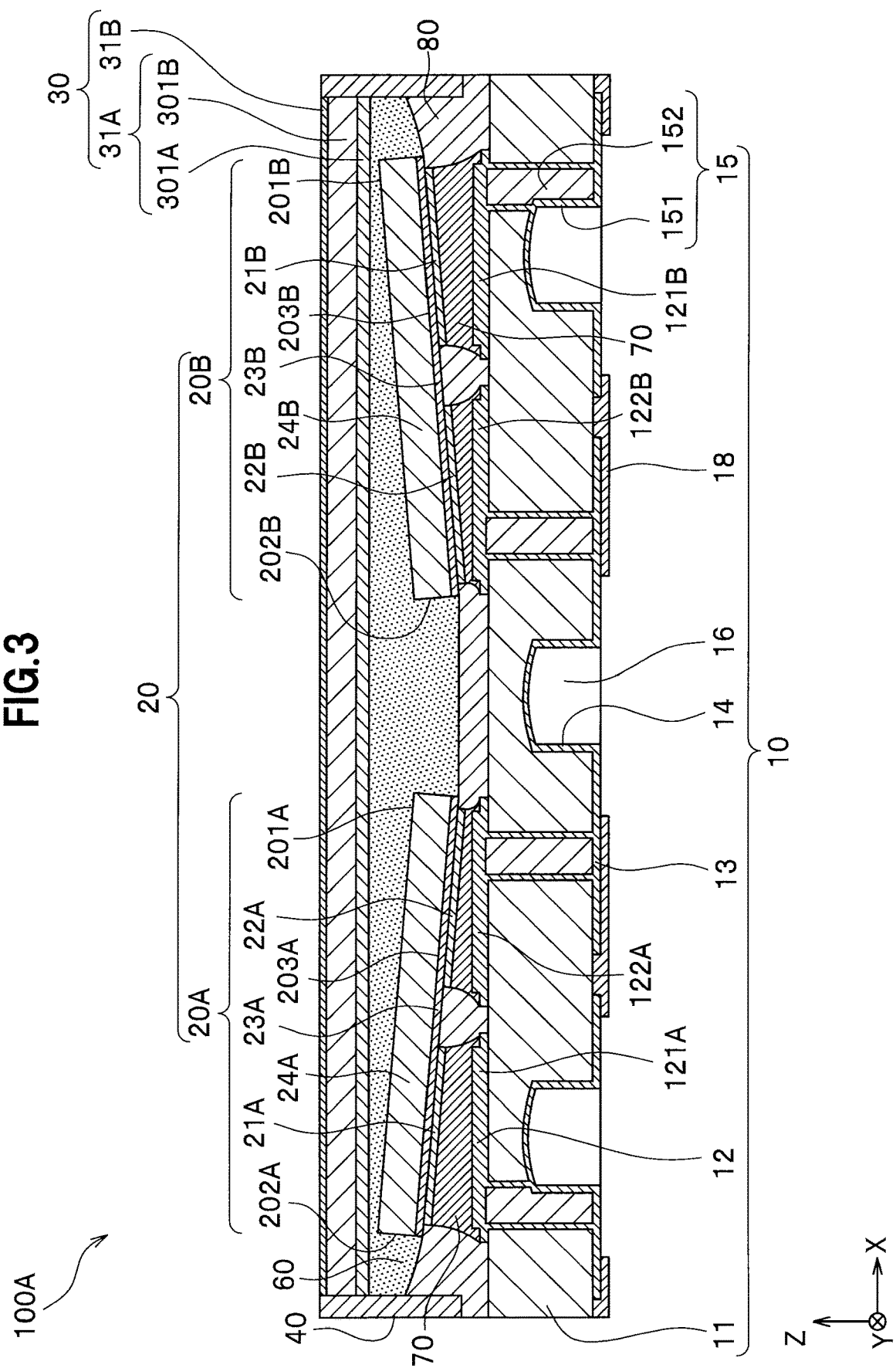
FIG. 3 is a schematic cross-sectional view of a first modified example of the light-emitting device according to the first embodiment of the present disclosure.

FIG. 3 is a schematic cross-sectional view for illustrating the structure of a first modified example of the light-emitting device 100 according to the first embodiment. A light-emitting device 100A according to the first modified example is described referring to FIG. 3.

A difference between the light-emitting device 100A according to the first modified example and the light-emitting device 100 according to the first embodiment is that the light-emitting device 100A includes a second reflective member 80.

Another difference from the light-emitting device 100 is that the lower surface of the first reflective member 40 is covered by the second reflective member 80.

The second reflective member 80 is continuously disposed between the lower surfaces of the first light-emitting element 20A and the second light-emitting element 20B and the upper surface of the substrate 10. More specifically, the second reflective member 80 is disposed between the first element electrode formation surface 203A and the upper surface of the substrate 10 and between the second element electrode formation surface 203B and the upper surface of the substrate 10. With the first element electrode formation surface 203A and the second element electrode formation surface 203B covered with the second reflective member 80, absorption of light emitted from the first light-emitting element 20A and the second light-emitting element 20B into the substrate 10 can be reduced. This structure allows for increasing the light extraction efficiency of the light-emitting device 100A.

The second reflective member 80 preferably includes inclined portion(s) that has a thickness gradually increased from the first light-emitting element 20A and/or the second light-emitting element 20B toward the outer lateral surface (s) of the light-emitting device 100A. With the second reflective member 80 including the inclined portion, extraction efficiency of light emitted from the first light-emitting element 20A and/or the second light-emitting element 20B can be increased.

The light reflectance of the second reflective member 80 at the peak emission wavelength of each light-emitting element is preferably 70% or greater, more preferably 80% or more, further preferably 90% or greater, in view of the light extraction efficiency in the Z direction.

A resin same as the resin used for the first reflective member 40 is preferably used for a base material of the second reflective member 80. A material and a pigment that are the same as those of the first reflective member 40 can be used for the second reflective member 80 at contents as in the first reflective member 40.

With the light-emitting device 100A including the second reflective member 80, light may not leak out from the outer lateral surfaces of the light-guide member 60 even in the case where the lower surface of the first reflective member 40 is covered with the second reflective member 80. Accordingly, in the case where the second reflective member 80 is provided, the lower surface of the first reflective member 40 may be covered with the second reflective member 80.

Second Modified Example

Figure 4:
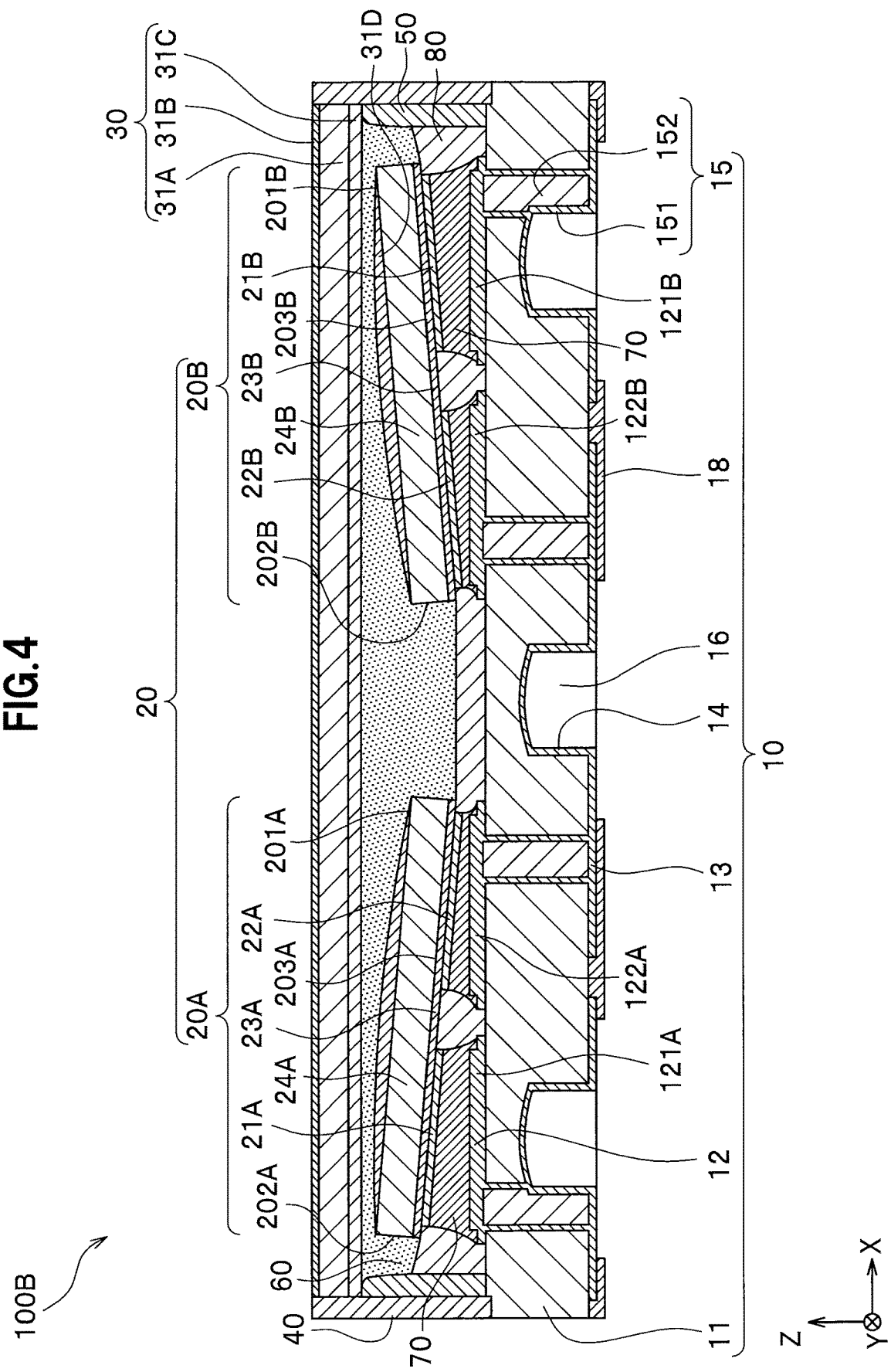
FIG. 4 is a schematic cross-sectional view of a second modified example of the light-emitting device according to the first embodiment of the present disclosure.

FIG. 4 is a schematic cross-sectional view for illustrating the structure of a second modified example of the light-emitting device 100 according to the first embodiment. A light-emitting device 100B according to the second modified example is described referring to FIG. 4.

The light-emitting device 100B according to the second modified example is different from the light-emitting device 100 according to the first embodiment in that the wavelength conversion layer 31A is a single layer and that a second light-transmissive layer 31C is disposed between the light-guide member 60 and the wavelength conversion layer 31A.

Further, the light-emitting device 100B according to the second modified example is different from the light-emitting device 100 in that at least one covering member 31D covers the light extracting surfaces of the light-emitting elements and that the light-emitting device 100B includes the second reflective member 80 and third reflective member(s) 50.

The light-transmissive member 30 of the light-emitting device 100B includes the second light-transmissive layer 31C facing the first element light extracting surface 201A and the second element light extracting surface 201B, the wavelength conversion layer 31A disposed on the second light-transmissive layer 31C, and the first light-transmissive layer 31B disposed on the wavelength conversion layer 31A. The second light-transmissive layer 31C, the wavelength conversion layer 31A, and the first light-transmissive layer 31B are layered in a layered structure.

The base materials of the wavelength conversion layer 31A and the second light-transmissive layer 31C may be the same resin material or different resin materials.

The second light-transmissive layer 31C preferably contains the base material and second diffusing particles. With the light-transmissive member 30 including the second light-transmissive layer 31C containing the second diffusing particles, the second light-transmissive layer 31C can easily diffuse light emitted from the first light-emitting element 20A and light emitted from the second light-emitting element 20B. Accordingly, unevenness in emission color of the light-emitting device 100B can be reduced.

The second light-transmissive layer 31C preferably has a thickness of 10 μm or greater and 50 μm or less.

For example, titanium oxide, silicon oxide, aluminum oxide, zirconium oxide, or zinc oxide can be used for the second diffusing particles.

The first diffusing particles and the second diffusing particles may be made of the same material or different materials. The second diffusing particles are preferably made of a material with a refractive index lower than a refractive index of a material of the first diffusing particles. For example, titanium oxide can be selected as a material of the first diffusing particles, and silicon oxide can be selected as a material of the second diffusing particles. This allows for reducing light diffused by the second diffusing particles, so that light extraction efficiency of the light-emitting device 100B can be increased.

The first element light extracting surface 201A of the first light-emitting element 20A is covered with corresponding one or more of the at least one covering member 31D. The second element light extracting surface 201B of the second light-emitting element 20B is covered with corresponding one or more of the at least one covering member 31D.

When the light-emitting device 100B includes a single covering member 31D, the single covering member 31D may continuously cover the first element light extracting surface 201A of the first light-emitting element 20A and the second element light extracting surface 201B of the second light-emitting element 20B. When the light-emitting device 100B includes a plurality of covering members 31D, the plurality of covering members 31D may intermittently cover a portion of the first element light extracting surface 201A of the first light-emitting element 20A and a portion of the second element light extracting surface 201B of the second light-emitting element 20B. This arrangement allows a portion of the light extracting surface of each light-emitting element to be exposed from the covering members 31D, which allows for increasing the light extraction efficiency of each light-emitting element.

The covering member 31D may cover at least a portion of the first element lateral surfaces 202A and at least a portion of the second element lateral surfaces 202B. In this case, at least a portion of the first element lateral surfaces 202A and at least a portion of the second element lateral surfaces 202B is preferably exposed. This structure allows for preventing reduction in light emitted from the first light-emitting element 20A and traveling in the X direction and/or the Y direction and light emitted from the second light-emitting element 20B and traveling in the X direction and/or the Y direction.

For the base material of the covering member 31D, a resin, such as a silicone resin, an epoxy resin, a phenolic resin, a polycarbonate resin, an acrylic resin, or a modified resin of these resins. In particular, a silicone resin or a modified silicone resin, which has good heat and light resistance, is preferably used. Examples of the silicone resins include dimethyl silicone resins, phenyl-methyl silicone resins, and diphenyl silicone resins.

The covering member 31D preferably contains diffusing particles (third diffusing particles) in the base material. With the covering member 31D containing the diffusing particles (third diffusing particles), light emitted from the first light-emitting element 20A and traveling in the Z direction and light emitted from the second light-emitting element 20B and traveling in the Z direction cam be reduced, so that light traveling in the X direction and/or the Y direction can be increased. This allows light emitted from the first light-emitting element 20A and light emitted from the second light-emitting element 20B to be diffused in the light-guide member 60, so that unevenness in emission color of the light-emitting device 100B is reduced.

The covering member 31D may contain a wavelength conversion substance in the base material. With the covering member 31D containing the wavelength conversion substance, emission color of the light-emitting device 100B can be adjusted. The wavelength conversion substance contained in the covering member 31D may be the same as or different from the wavelength conversion substance contained in the wavelength conversion layer 31A of the light-transmissive member 30. For example, in the case where the peak emission wavelength of the second light-emitting element 20B is 490 nm or greater and 570 nm or less (green wavelength range), the wavelength conversion substance is preferably a CASN phosphor and/or a SCASN phosphor excited by light of 490 nm or greater and 570 nm or less. A phosphor such as $(Sr,Ca)LiAl_3N_4:Eu$ may also be used for the wavelength conversion substance.

The third reflective member 50 is disposed between the first light-emitting element 20A and the first reflective member 40 and between the second light-emitting element 20B and the first reflective member 40 in the longitudinal direction. In addition, the third reflective member 50 is disposed in contact with the first reflective member 40 and the light-transmissive member 30.

In the light-emitting device 100B, light emitted from the lateral surfaces of each light-emitting element can be reflected at the third reflective member 50 toward the light-transmissive member 30, so that light extraction efficiency can be increased.

The light reflectance of the third reflective member 50 at the peak emission wavelength of each light-emitting element is preferably 70% or greater, more preferably 80% or more, further preferably 90% or greater.

A resin same as the resin used for the first reflective member 40 is preferably used for the base material of the third reflective member 50. A material and a pigment the same as those of the first reflective member 40 can be used for the third reflective member 50 at a content same as that of the first reflective member 40.

Third Modified Example

Figure 5:
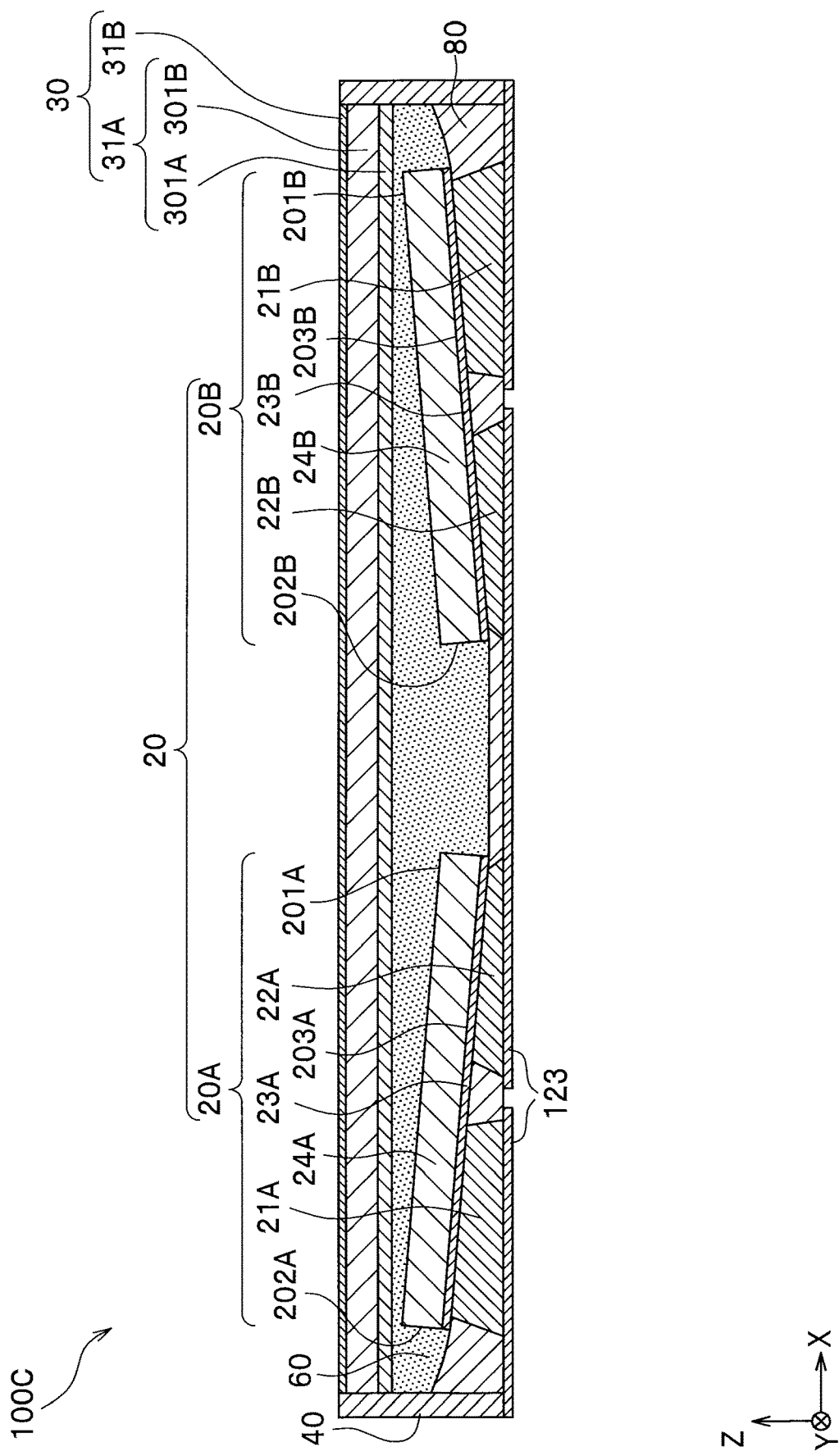
FIG. 5 is a schematic cross-sectional view of a third modified example of the light-emitting device according to the first embodiment of the present disclosure.

FIG. 5 is a schematic cross-sectional view for illustrating the structure of a third modified example of the light-emitting device 100 according to the first embodiment. A light-emitting device 100C according to the third modified example is described referring to FIG. 5.

A difference between the light-emitting device 100C according to the third modified example and the light-emitting device 100 according to the first embodiment is that the light-emitting device 100C does not include the substrate 10.

Another difference from the light-emitting device 100 is that the light-emitting device 100C includes the second reflective member 80.

Still another difference between the light-emitting device 100C according to the third modified example and the light-emitting device 100 is that the heights of the electrodes of the light-emitting device 100C are adjusted such that the first light-emitting element 20A and the second light-emitting element 20B are inclined.

As in the light-emitting device 100C shown in FIG. 5, without the substrate 10 above which the first light-emitting element 20A and the second light-emitting element 20B are placed, a thickness of the light-emitting device 100C in the Z direction can be further reduced.

Further, as in the light-emitting device 100C shown in FIG. 5, without the substrate 10 above which the first light-emitting element 20A and the second light-emitting element 20B are placed, the first element electrode formation surface 203A and the second element electrode formation surface 203B are covered with the second reflective member 80, which allows for reducing absorption of light emitted from the first light-emitting element 20A and light emitted from the second light-emitting element 20B into the mounting board above which the light-emitting device 100C is mounted. This structure allows for increasing the light extraction efficiency of the light-emitting device 100C.

The second reflective member 80 is continuously disposed on the lower surfaces of the first light-emitting element 20A and the second light-emitting element 20B.

As in the light-emitting device 100C shown in FIG. 5, in the case of not including the substrate 10 on or above which the first light-emitting element 20A and the second light-emitting element 20B are placed, the first light-emitting element 20A and the second light-emitting element 20B are preferably connected via metal films 123 formed by sputtering or the like. With the metal films 123, the first light-emitting element 20A and the second light-emitting element 20B can be electrically connected.

In the light-emitting device 100C, the heights of the plurality of electrodes of each light-emitting element are different from each other.

In the first light-emitting element 20A, the height of the first outer electrode 21A is greater than the height of the first inner electrode 22A, which allows the active layer of the first light-emitting element 20A to be inclined relative to a surface on or above which the light-emitting element is placed (relative to the light-emitting surface of the light-emitting device 100) toward the center of the light-emitting device 100C.

Also, in the second light-emitting element 20B, with the height of the second outer electrode 21B greater than the height of the second inner electrode 22B, the active layer of the second light-emitting element 20B is inclined relative to a surface on or above which the light-emitting element is placed (relative to the light-emitting surface of the light-emitting device 100) toward the center of the light-emitting device 100C.

With this structure, the active layer of the first light-emitting element 20A and the active layer of the second light-emitting element 20B defines an angle θ of less than 180° at the wavelength conversion layer 31A side.

In the case of not including the substrate 10, another structure may allow the active layers to be inclined.

Fourth Modified Example

Figure 6:
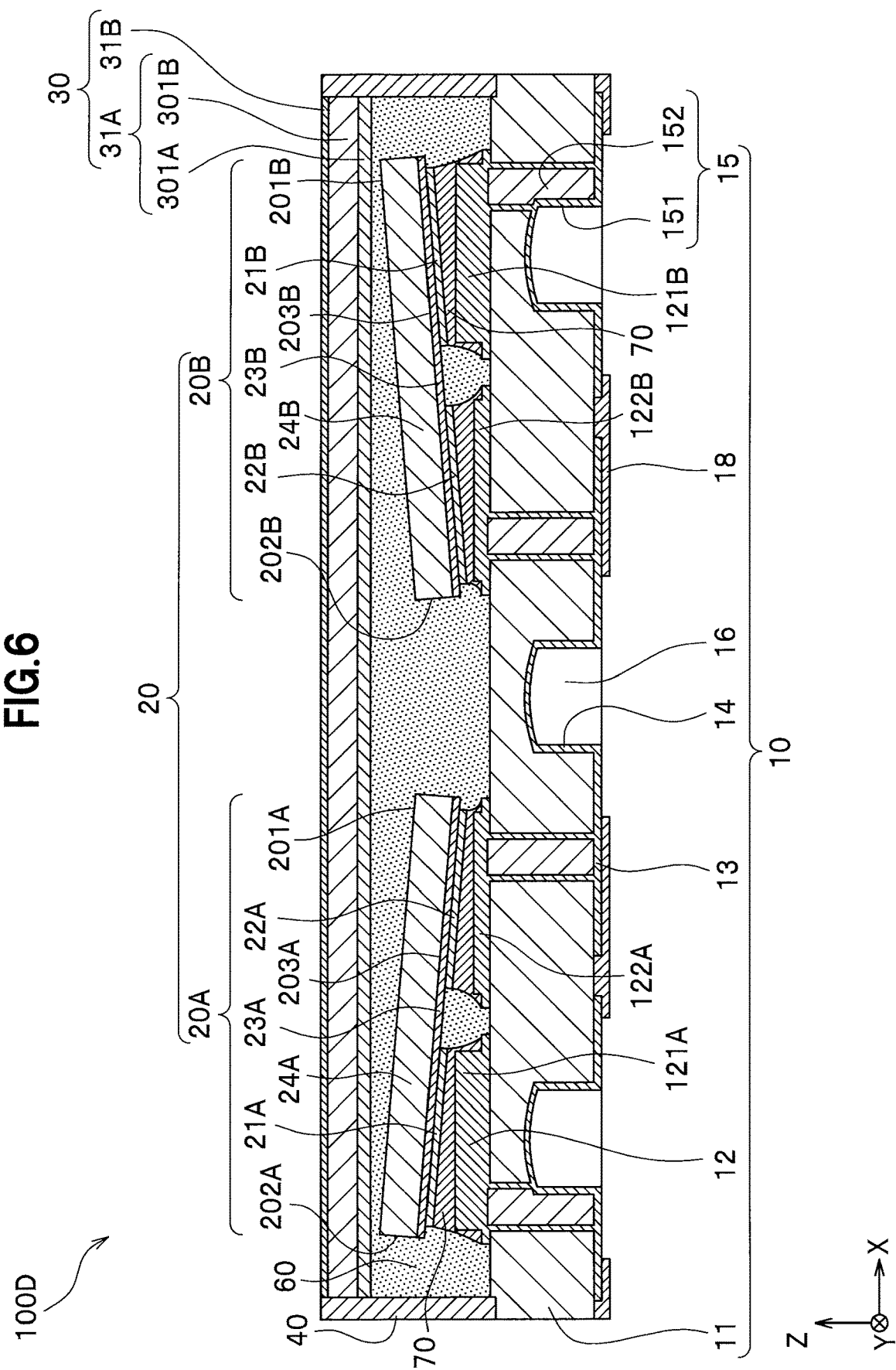
FIG. 6 is a schematic cross-sectional view of a fourth modified example of the light-emitting device according to the first embodiment of the present disclosure.

FIG. 6 is a schematic cross-sectional view for illustrating the structure of a fourth modified example of the light-emitting device 100 according to the first embodiment. A light-emitting device 100D according to the fourth modified example is described referring to FIG. 6.

A difference between the light-emitting device 100D according to the fourth modified example and the light-emitting device 100 according to the present embodiment is that the heights of the projections of the first wirings 12 on the substrate 10 of the light-emitting device 100D are adjusted such that the first light-emitting element 20A and the second light-emitting element 20B are inclined.

In the light-emitting device 100D, the heights of the projections each connected to a respective one of the plurality of electrodes of each light-emitting element are different from each other.

The height of the first outer projection 121A connected to the first outer electrode 21A is greater than the height of the first inner projection 122A connected to the first inner electrode 22A, so that the active layer of the first light-emitting element 20A is inclined toward the center of the light-emitting device 100D relative to a surface on or above which the light-emitting element is placed.

Also, the height of the second outer projection 121B connected to the second outer electrode 21B is greater than the height of the second inner projection 122B connected to the second inner electrode 22B, so that the active layer of the second light-emitting element 20B is inclined toward the center of the light-emitting device 100D relative to the surface on or above which the light-emitting element is placed.

With this structure, the angle θ defined by the active layer of the first light-emitting element 20A and the active layer of the second light-emitting element 20B is less than 180° at the wavelength conversion layer 31A side.

Fifth Modified Example

Figure 7:
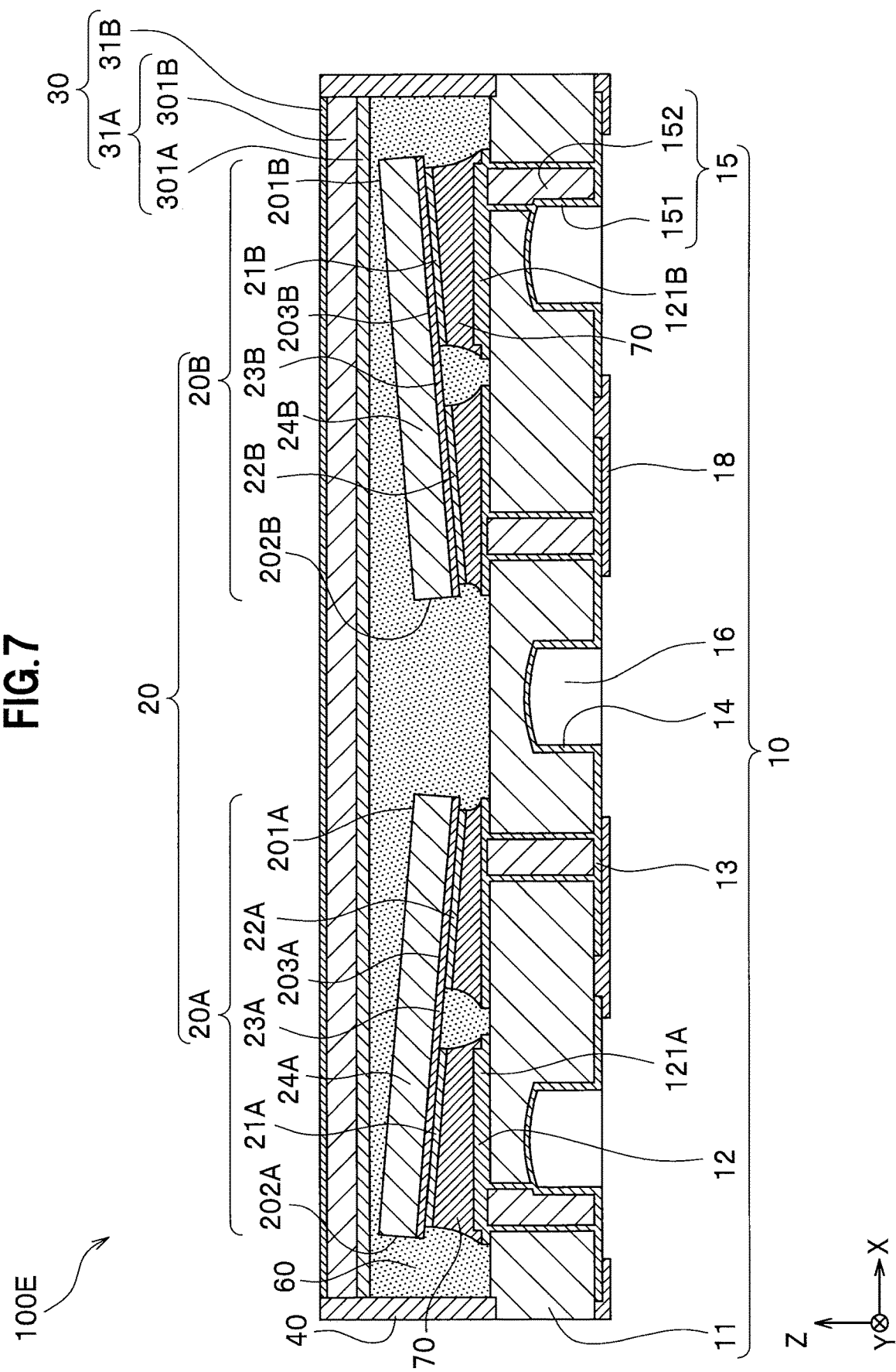
FIG. 7 is a schematic cross-sectional view of a fifth modified example of the light-emitting device according to the first embodiment of the present disclosure.

FIG. 7 is a schematic cross-sectional view for illustrating the structure of a fifth modified example of the light-emitting device 100 according to the first embodiment. A light-emitting device 100E according to the fifth modified example is described referring to FIG. 7.

The light-emitting device 100E according to the fifth modified example is different from the light-emitting device 100 according to the first embodiment in that some of the first wirings 12 on the substrate 10 do not include protrusions and the heights of the electrically-conductive adhesive members 70 are adjusted such that the first light-emitting element 20A and the second light-emitting element 20B are inclined.

In light-emitting device 100E, the first wiring 12 connected to the first inner electrode 22A of the first light-emitting element 20A does not include the first inner projection 122A, and the electrically-conductive adhesive member 70 bonded to the first outer electrode 21A of the first light-emitting element 20A has a height greater than the height of the electrically-conductive adhesive member 70 bonded to the first inner electrode 22A. With this structure, the active layer of the first light-emitting element 20A is inclined toward the center of the light-emitting device 100E relative to a surface on or above which the light-emitting element is placed.

Further, the first wiring 12 connected to the second inner electrode 22B of the second light-emitting element 20B does not include the second inner projection 122B, and the electrically-conductive adhesive member 70 bonded to the second outer electrode 21B has a height greater than the height of the electrically-conductive adhesive member 70 bonded to the second inner electrode 22B. With this structure, the active layer of the second light-emitting element 20B is inclined toward the center of the light-emitting device 100E relative to the surface on or above which the light-emitting element is placed.

Accordingly, the angle θ defined by the active layer of the first light-emitting element 20A and the active layer of the second light-emitting element 20B is less than 180° at the wavelength conversion layer 31A side.

In this example, the first wirings 12 do not include the first inner projection 122A and the second inner projection 122B, and the heights of the electrically-conductive adhesive members 70 are adjusted. Meanwhile, the electrically-conductive adhesive members 70 bonded to the electrodes of the first light-emitting element 20A and the electrodes of the second light-emitting element 20B may have the same height while the first wiring 12 bonded to the first inner electrode 22A does not include the first inner projection 122A and the first wiring 12 bonded to the second inner electrode 22B does no including the second inner projection 122B, which allows the active layer of the first light-emitting element 20A and the active layer of the second light-emitting element 20B to be inclined.

Sixth Modified Example

Figure 8:
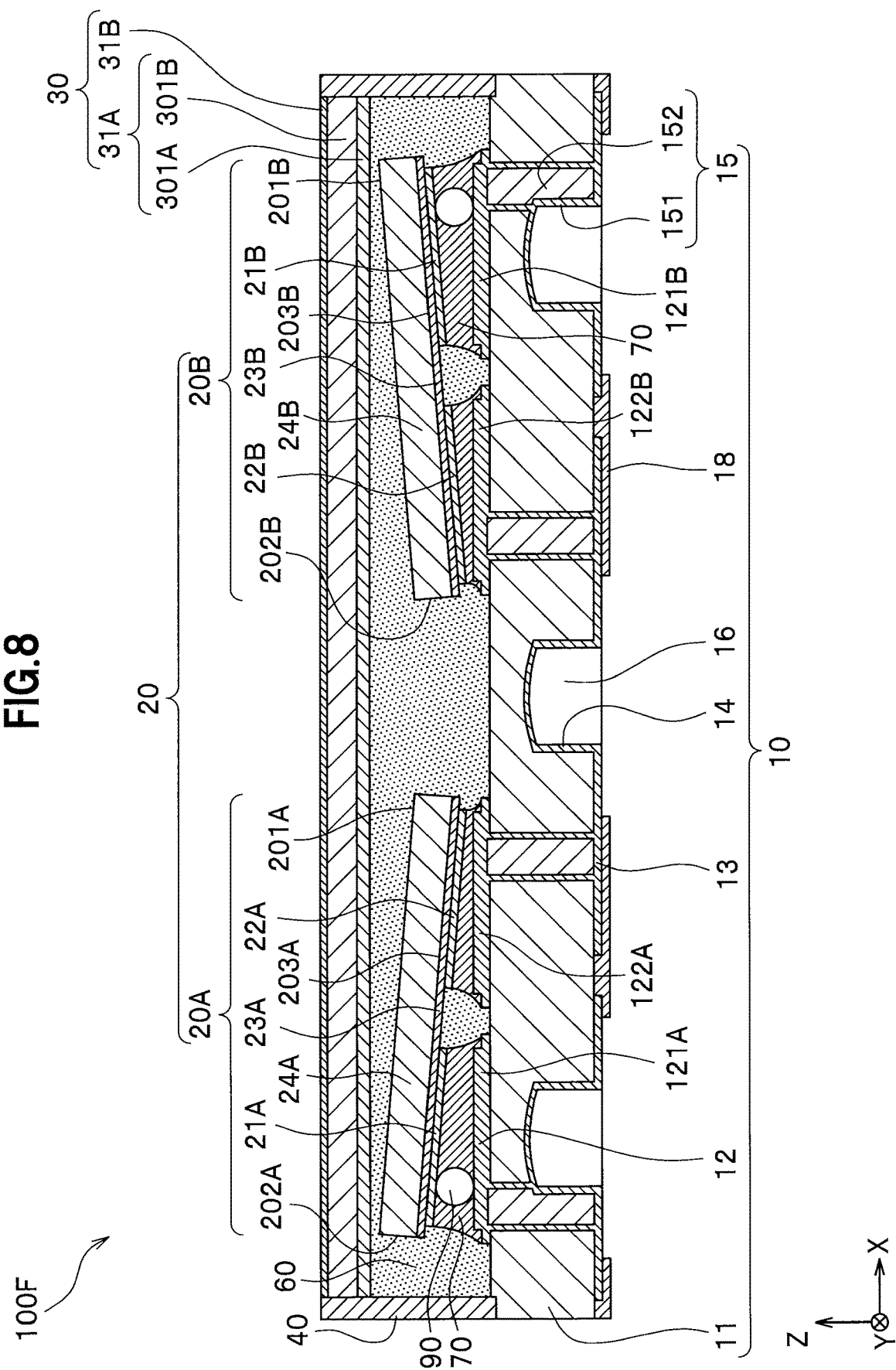
FIG. 8 is a schematic cross-sectional view of a sixth modified example of the light-emitting device according to the first embodiment of the present disclosure.

FIG. 8 is a schematic cross-sectional view for illustrating the structure of a sixth modified example of the light-emitting device 100 according to the first embodiment. A light-emitting device 100F according to the sixth modified example is described referring to FIG. 8.

The light-emitting device 100F according to the sixth modified example is different from the light-emitting device 100 according to the first embodiment in that a spacer 90 is disposed between the lower surface of each outer electrode and the upper surface of the substrate 10 such that the first light-emitting element 20A and the second light-emitting element 20B are inclined.

The light-emitting device 100F includes a plurality of spacers 90 each disposed between the lower surface of a corresponding one of the first outer electrode 21A and the second outer electrode 21B and the upper surface of the substrate 10. With this structure, the active layer of the first light-emitting element 20A and the active layer of the second light-emitting element 20B of the light-emitting device 100F are inclined toward the center of the light-emitting device 100F relative to the surface on or above which the light-emitting elements are placed.

Accordingly, the angle θ defined by the active layer of the first light-emitting element 20A and the active layer of the second light-emitting element 20B is less than 180° at the wavelength conversion layer 31A side.

For example, balls made of copper, iron, aluminum, titanium, or an alloy containing at least one of these metals can be used for the plurality of spacers 90.

In the light-emitting device 100F, the inclination angles of the active layers can be adjusted by adjusting the positions of the plurality of spacers 90. For example, with the spacer 90 between the lower surface of the first outer electrode 21A and the upper surface of the substrate 10 and the spacer 90 between the lower surface of the second outer electrode 21B and the upper surface of the substrate 10 disposed more inward, the angle θ at the wavelength conversion layer 31A side defined by the active layer of the first light-emitting element 20A and the active layer of the second light-emitting element 20B can be reduced.

The inclination angles of the active layers can be adjusted by adjusting the sizes of the plurality of spacers 90. For example, increase in the sizes of the spacer 90 between the lower surface of the first outer electrode 21A and the upper surface of the substrate 10 and the spacer 90 between the lower surface of the second outer electrode and the upper surface of the substrate 10 allows for reducing the angle θ at the wavelength conversion layer 31A side defined by the active layer 232A of the first light-emitting element 20A and the active layer 232B of the second light-emitting element 20B.

Seventh Modified Example

Figure 9:
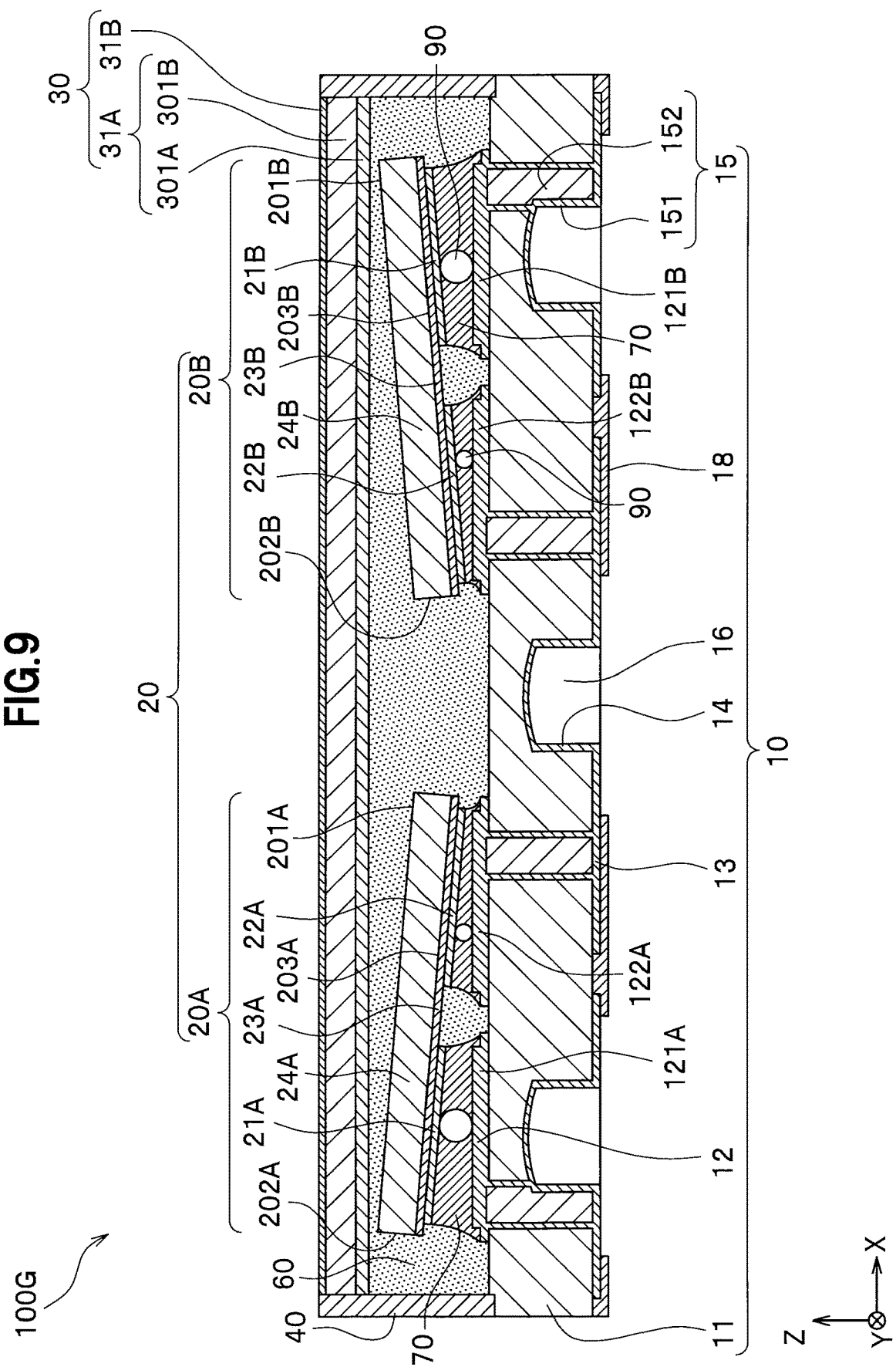
FIG. 9 is a schematic cross-sectional view of a seventh modified example of the light-emitting device according to the first embodiment of the present disclosure.

FIG. 9 is a schematic cross-sectional view for illustrating the structure of a seventh modified example of the light-emitting device 100 according to the first embodiment. A light-emitting device 100G according to the seventh modified example is described referring to FIG. 9.

The light-emitting device 100G according to the seventh modified example is different from the light-emitting device 100 according to the first embodiment in that a spacer 90 is disposed between the lower surface of each of the outer and inner electrodes and the upper surface of the substrate 10 such that the first light-emitting element 20A and the second light-emitting element 20B are inclined.

The light-emitting device 100G includes the plurality of spacers 90 each disposed between the lower surface of a corresponding one of the first outer electrode 21A, the first inner electrode 22A, the second outer electrode 21B, and the second inner electrode 22B and the upper surface of the substrate 10.

The size of the spacer 90 between the lower surface of the first outer electrode 21A of the first light-emitting element 20A and the upper surface of the substrate 10 is larger than the size of the spacer 90 between the lower surface of the first inner electrode 22A and the upper surface of the substrate 10, so that the active layer of the first light-emitting element 20A is inclined toward the center of the light-emitting device 100G relative to a surface on or above which the light-emitting element is placed.

Further, the size of the spacer 90 between the lower surface of the second outer electrode 21B of the second light-emitting element 20B and the upper surface of the substrate 10 is larger than the size of the spacer 90 between the lower surface of the second inner electrode 22B and the upper surface of the substrate 10, so that the active layer of the second light-emitting element 20B is inclined toward the center of the light-emitting device 100G relative to a surface on or above which the light-emitting element is placed.

Accordingly, the angle θ defined by the active layer of the first light-emitting element 20A and the active layer of the second light-emitting element 20B is less than 180° at the wavelength conversion layer 31A side.

As described for the light-emitting device 100F, in the light-emitting device 100G, the inclination angles of the active layers can be adjusted by adjusting the positions or sizes of the plurality of spacers 90.

Eighth Modified Example

Figure 10:
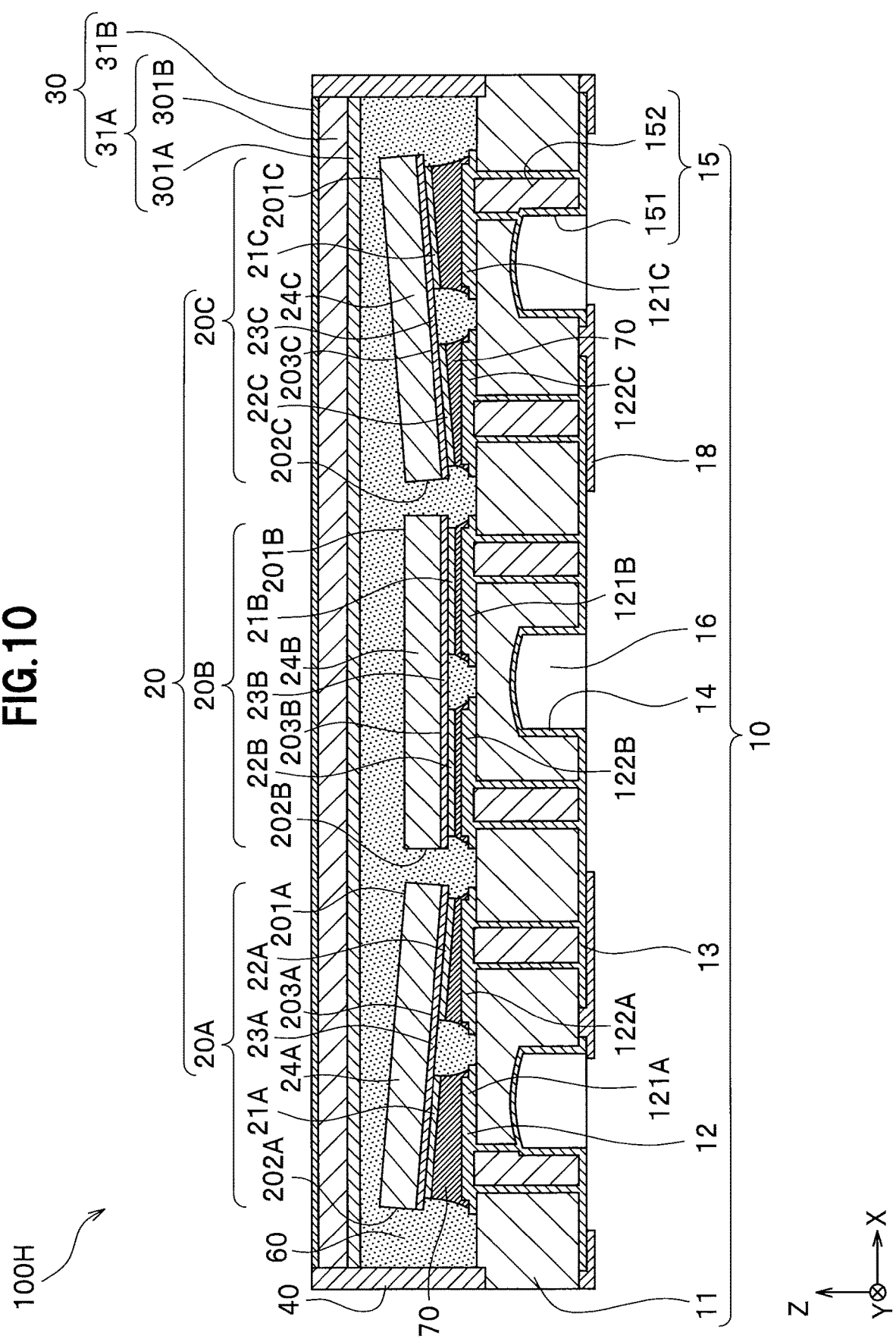
FIG. 10 is a schematic cross-sectional view of an eighth modified example of the light-emitting device according to the first embodiment of the present disclosure.
Figure 11:
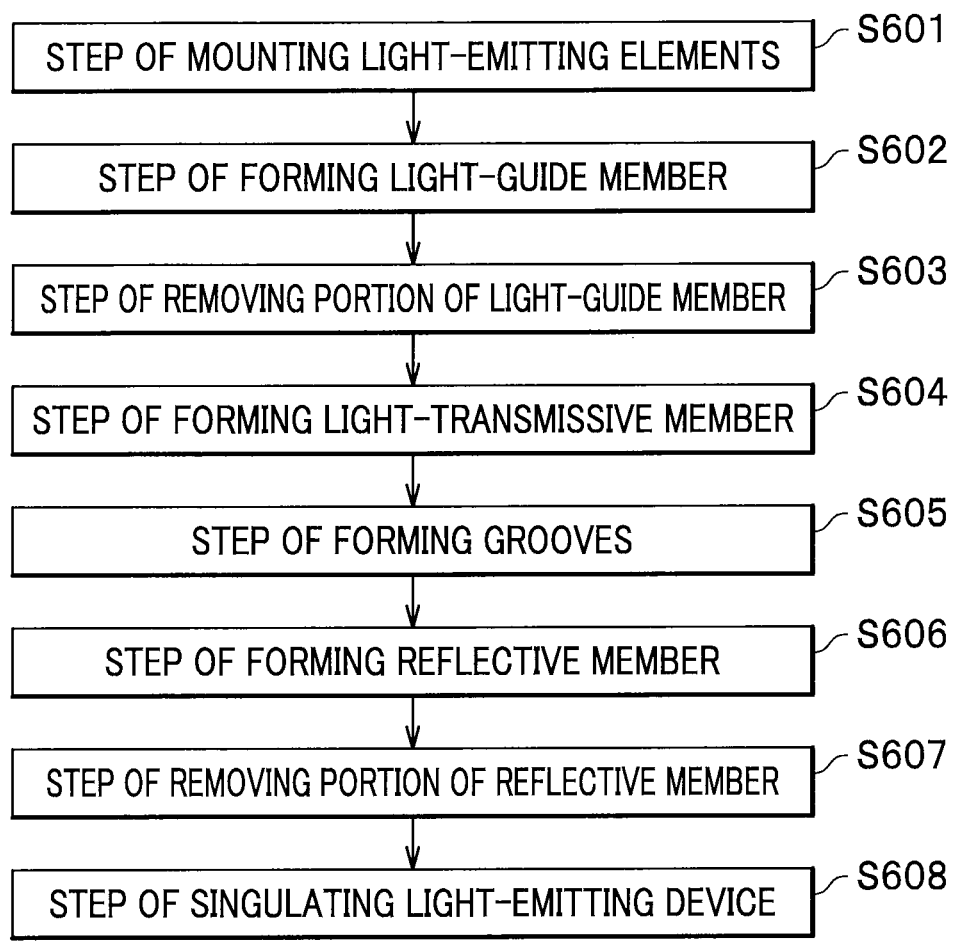
FIG. 11 is a flowchart illustrating a method of manufacturing the light-emitting device according to the first embodiment of the present disclosure.

FIG. 10 is a schematic cross-sectional view for illustrating the structure of an eighth modified example of the light-emitting device 100 according to the first embodiment. A light-emitting device 100H according to the eighth modified example is described referring to FIG. 10.

A difference between the light-emitting device 100H according to the eighth modified example and the light-emitting device 100 according to the present embodiment is that three light-emitting elements are mounted in the light-emitting device 100H.

The light-emitting device 100H includes the first light-emitting element 20A, the second light-emitting element 20B, and a third light-emitting element 20C.

The third light-emitting element 20C has a third element light extracting surface 201C, a third element electrode formation surface 203C opposite to the third element light extracting surface, and third element lateral surfaces 202C between the third element light extracting surface 201C and the third element electrode formation surface 203C. The third light-emitting element 20C has substantially the same structure as in the first light-emitting element 20A, and thus detailed description thereof will not be provided below.

The light-guide member 60 covers the first element light extracting surface 201A, the first element lateral surfaces 202A, the second element light extracting surface 201B, the second element lateral surfaces 202B, the third element light extracting surface 201C, and the third element lateral surfaces 202C. In one example, the wavelength conversion layer 31A is spaced apart from the first light-emitting element 20A, the second light-emitting element 20B, and the third light-emitting element 20C such that the light-guide member 60 is disposed between the wavelength conversion layer 31A and each of the first light-emitting element 20A, the second light-emitting element 20B, and the third light-emitting element 20C, and the wavelength conversion layer 31A continuously covers the first element light extracting surface 201A, the second element light extracting surface 201B, and the third element light extracting surface 201C.

The first light-emitting element 20A, the second light-emitting element 20B, and the third light-emitting element 20C are placed on corresponding ones of the first wirings 12 of a substrate 10 such that corresponding ones of the plurality of electrically-conductive adhesive members 70 are disposed between each of the first light-emitting element 20A, the second light-emitting element 20B, and the third light-emitting element 20C and the corresponding ones of the first wirings 12. In one example, the first light-emitting element 20A and the third light-emitting element 20C are blue light-emitting elements, and the second light-emitting element 20B is a green light-emitting element.

In the light-emitting device 100H, the second light-emitting element 20B is located between the first light-emitting element 20A and the third light-emitting element 20C in a top view.

The electrically-conductive adhesive member 70 bonded to the first outer electrode 21A has a height greater than the height of the electrically-conductive adhesive member 70 bonded to the first inner electrode 22A. With this structure, the active layer of the first light-emitting element 20A is inclined toward the center of the light-emitting device 100H relative to a surface on or above which the light-emitting element is placed.

Also, the electrically-conductive adhesive member 70 bonded to a third outer electrode 21C has a height greater than the height of the electrically-conductive adhesive member 70 bonded to a third inner electrode 22C. With this structure, the active layer of the third light-emitting element 20C is inclined toward the center of the light-emitting device 100H relative to the surface on or above which the light-emitting element is placed.

Accordingly, the angle θ defined by the active layer of the first light-emitting element 20A and the active layer of the second light-emitting element 20B is less than 180° at the wavelength conversion layer 31A side. Further, an angle θ defined by the active layer of the third light-emitting element 20C and the active layer of the second light-emitting element 20B is less than 180° at the wavelength conversion layer 31A side. More specifically, in the light-emitting device 100H, the active layer of the first light-emitting element 20A and the active layer of the third light-emitting element 20C are inclined toward the center of the light-emitting device 100H relative to the surface on or above which the light-emitting elements are placed. In one example, as shown in FIG. 10, in the plane defined by the X direction and the Z direction, the first light-emitting element 20A and the third light-emitting element 20C are inclined such that each of the first light-emitting element 20A and the third light-emitting element 20C is located at varied heights in the Z direction. With this structure, the optical axis of the first light-emitting element 20A, the optical axis of the second light-emitting element 20B, and the optical axis of the third light-emitting element 20C intersect one another at the light-emitting surface side of the light-emitting device 100H.

The angle θ is as described for the light-emitting device 100 according to the first embodiment.

The peak emission wavelength of the third light-emitting element 20C is preferably equal to the peak emission wavelength of the first light-emitting element 20A and different from the peak emission wavelength of the second light-emitting element 20B, and is preferably 430 nm or greater and less than 490 nm (blue wavelength range). The expression "equal to the peak emission wavelength" in the present specification encompasses deviation of about ±10 nm.

The peak emission wavelength of the first light-emitting element 20A may be 490 nm or greater and less than 570 nm (green wavelength range), the peak emission wavelength of the second light-emitting element 20B may be 430 nm or greater and less than 490 nm (blue wavelength range), and the peak emission wavelength of the third light-emitting element 20C may be 490 nm or greater and less than 570 nm (green wavelength range). While the peak emission wavelength of the first light-emitting element 20A, the peak emission wavelength of the second light-emitting element 20B, and the peak emission wavelength of the third light-emitting element 20C can be selected from a range of the ultraviolet region to the infrared region by selecting semiconductor materials and the ratio of the materials in the mixed crystal, it is preferable that the peak emission wavelength of the first light-emitting element 20A is equal to the peak emission wavelength of the third light-emitting element 20C and that the peak emission wavelength of the second light-emitting element 20B differs from the peak emission wavelength of the first light-emitting element 20A and the peak emission wavelength of the third light-emitting element 20C.

In the case where the peak emission wavelength of the third light-emitting element 20C is 430 nm or greater and less than 490 nm (blue wavelength range), the peak emission wavelength of the wavelength conversion substance is preferably 580 nm or greater and less than 680 nm (red wavelength range).

The peak emission wavelength of the wavelength conversion substance may be 580 nm or greater and less than 680 nm (red wavelength range) regardless of the peak emission wavelength of each light-emitting element.

Other Modified Examples

In the light-emitting device 100 and the like, both of the active layers of the first light-emitting element 20A and the second light-emitting element 20B are inclined relative to a surface on or above which the light-emitting elements are placed. The active layer(s) of at least one of the first light-emitting element 20A and the second light-emitting element 20B is inclined relative to a surface on or above which the light-emitting elements are placed. In the case where the active layer of the first light-emitting element 20A or the second light-emitting element 20B is inclined relative to a surface on or above which the light-emitting element is placed, for example, one of the structure described above that allows the active layer of the light-emitting element to be inclined may be employed for a corresponding one of the first light-emitting element 20A and the second light-emitting element 20B.

In the light-emitting device 100H shown in FIG. 10, the active layers of both of the first light-emitting element 20A and the third light-emitting element 20C are inclined relative to the surface on or above which the light-emitting elements are placed. Meanwhile, the third light-emitting element 20C may not be inclined relative to a surface on or above which the light-emitting elements are placed.

In the light-emitting device 100H, the second light-emitting element 20B is located between the first light-emitting element 20A and the third light-emitting element 20C in a top view. Meanwhile, the third light-emitting element 20C may be located between the first light-emitting element 20A and the second light-emitting element 20B, and the active layer of the first light-emitting element 20A and the active layer of the second light-emitting element 20B may be inclined toward the center of the light-emitting device 100H relative to a surface on or above which the light-emitting elements are placed.

The optical axes of two or more selected from the first light-emitting element 20A, the second light-emitting element 20B, and the third light-emitting element 20C preferably intersect each other at the light-emitting surface side of the light-emitting device.

The first light-transmissive layer 31B, the second light-transmissive layer 31C, the covering member 31D, the second reflective member 80, and the third reflective member 50 may be provided as needed or may not be provided in the embodiment and modified examples described above.

In the description above, adjustment of the heights of the plurality of electrically-conductive adhesive members 70, adjustment of the heights of the projections of the first wiring 12, use of the plurality of spacers 90, or adjustment of the heights of the electrodes of the light-emitting element allows the active layer of each light-emitting element described above to be inclined. These structures may be appropriately selected according to the structure of the light-emitting device or the like. Two or more of these methods may be employed in combination, or another method may be employed to achieve the inclination.

In the embodiment and modified examples described above, the light-emitting element is inclined such that its height in the Z direction varies in the plane defined by the X direction and the Z direction. In the plane defined by the Y direction and the Z direction, the light-emitting element may be inclined such that each light-emitting element is disposed at varied heights in the Z direction.

Any appropriate number of the light-emitting elements are provided as two or more light-emitting elements are provided.

The light-emitting devices according to the modified examples described above also allows for reducing unevenness in emission color.

Method of manufacturing Light-Emitting Device

Subsequently, a method of manufacturing the light-emitting device 100 according to the first embodiment is described referring to FIG. 11 and FIG. 12A to FIG. 12H. In the method of manufacturing the light-emitting device according to the first embodiment, some steps may be performed in any appropriate order, and may be changed from the order in description below.

The method of manufacturing the light-emitting device according to the first embodiment includes Step S601 of mounting light-emitting elements, Step S602 of forming a light-guide member, Step S603 of removing a portion of the light-guide member, Step S604 of forming a light-transmissive member, Step S605 of forming grooves, Step S606 of forming a reflective member, Step S607 of removing a portion of the reflective member, and Step S608 of singulating the light-emitting device.

Figure 12A:
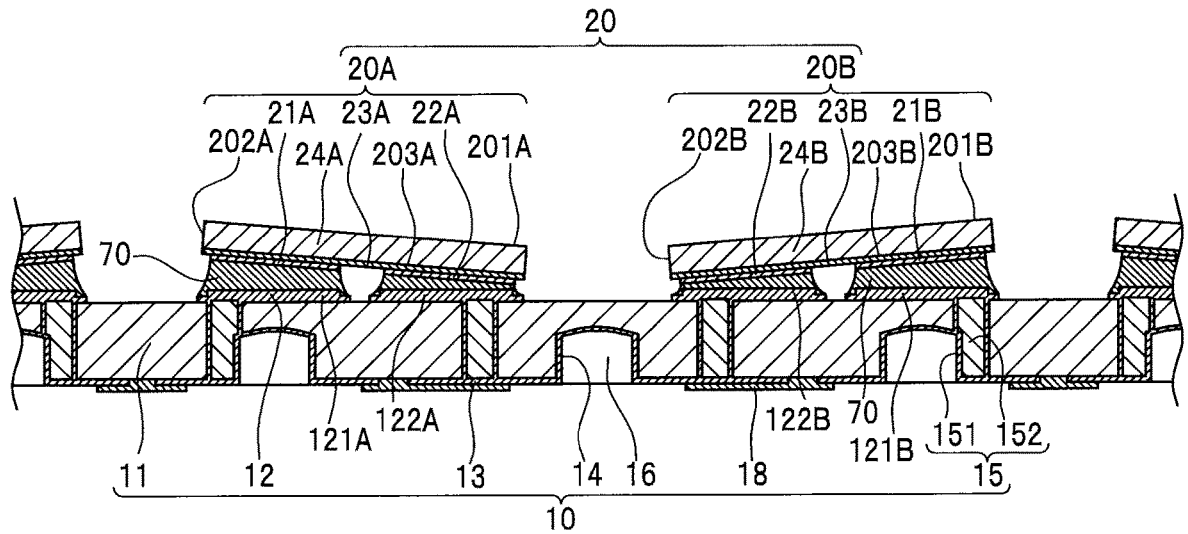
FIG. 12A is a schematic cross-sectional view for illustrating a step of mounting light-emitting elements in the method of manufacturing the light-emitting device according to the first embodiment of the present disclosure.

In Step S601 of mounting light-emitting elements, the first light-emitting element 20A (for example, a blue light-emitting element) and the second light-emitting element 20B (for example, a green light-emitting element) are mounted on the substrate 10 as shown in FIG. 12A.

In this step, the light-emitting elements are preferably flip-chip mounted by the reflow method with solder.

In this step, the plurality of electrically-conductive adhesive members 70 are disposed on the first wiring 12 of the substrate 10. At this time, the amount of the electrically-conductive adhesive member 70 bonded to the first outer electrode 21A of the first light-emitting element 20A is larger than the amount of the electrically-conductive adhesive member 70 bonded to the first inner electrode 22A of the first light-emitting element 20A. Similarly, the amount of the electrically-conductive adhesive member 70 bonded to the second outer electrode 21B of the second light-emitting element 20B is larger than the amount of the electrically-conductive adhesive member 70 bonded to the second inner electrode 22B of the second light-emitting element 20B.

The upper surfaces of the electrically-conductive adhesive members 70 disposed on the first wiring 12 are preferably flattened by, for example, applying heat and pressing with a plate-like member or the like. This operation allows for reducing unstableness of the light-emitting elements to be mounted, so that and stable mounting of the light-emitting elements can be facilitated.

Subsequently, the first light-emitting element 20A and the second light-emitting element 20B are placed above the substrate 10 such that each of the plurality of electrically-conductive adhesive members 70 is disposed between the substrate 10 and a corresponding one of the first light-emitting element 20A and the second light-emitting element 20B. The plurality of electrically-conductive adhesive members 70 are then hardened. Accordingly, a portion of the first light-emitting element 20A with a smaller amount of the electrically-conductive adhesive members 70 is located at a height lower than a height at which a portion of the first light-emitting element 20A with a larger amount of the electrically-conductive adhesive members 70 is located, so that the active layer of the first light-emitting element 20A and the active layer of the second light-emitting element 20B are inclined toward the inside of the substrate 10 relative to a surface on or above which the light-emitting elements are placed. The amounts and positions of the electrically-conductive adhesive members 70 are appropriately adjusted so that the active layer of the first light-emitting element 20A and the active layer of the second light-emitting element 20B are inclined. Adjustment of the amounts of the electrically-conductive adhesive members 70 allows for adjusting inclination angles.

Figure 12B:
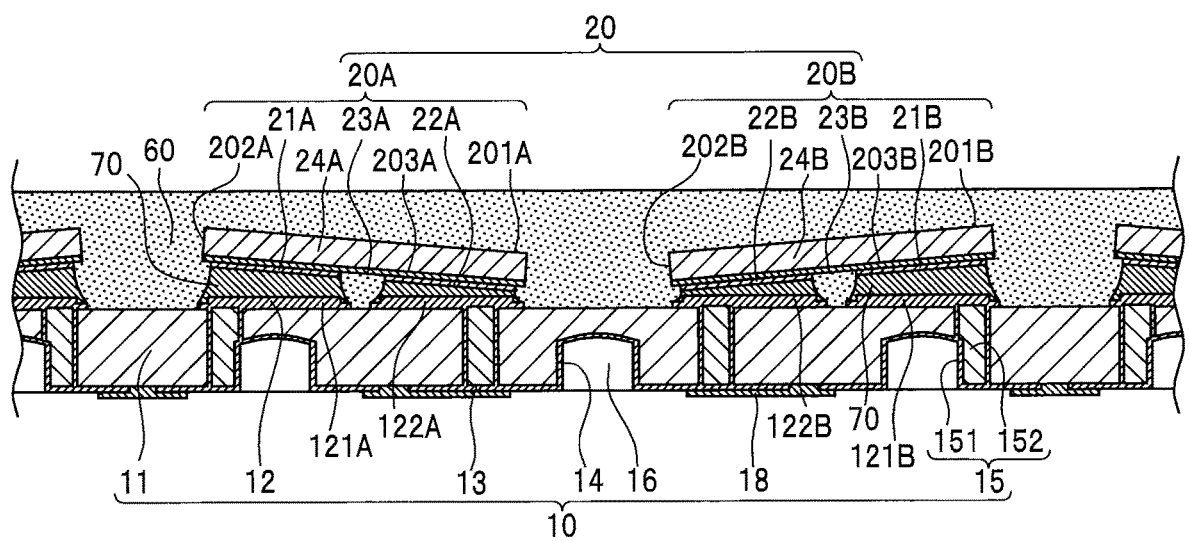
FIG. 12B is a schematic cross-sectional view for illustrating a step of forming a light-guide member in the method of manufacturing the light-emitting device according to the first embodiment of the present disclosure.

In Step S602 of forming a light-guide member, the light-guide member 60 that covers the first element light extracting surface 201A and the first element lateral surfaces 202A of the first light-emitting element 20A and the second element light extracting surface 201B and the second element lateral surfaces 202B of the second light-emitting element 20B is formed as shown in FIG. 12B. In this step, it is preferable that the lateral surfaces and the light extracting surface of each light-emitting element are entirely covered with light-guide member such that the upper surface of the light-guide member 60 is substantially flat as shown in FIG. 12B.

In this step, the light-guide member 60 is formed by, for example, dropping a liquid resin material containing the base material and the wavelength conversion substance onto the mounting surface on or above which the first light-emitting element 20A and the second light-emitting element 20B have been mounted. Compression molding or transfer molding may be employed. Alternatively, for example, using a technique such as spraying, electrodeposition, or the like, the wavelength conversion substance is applied to the mounting surface on or above which the first light-emitting element 20A and the second light-emitting element 20B have been mounted, then the base material is dropped so to be impregnated with the wavelength conversion substance, and the base material is solidified, so that the light-guide member 60 can be formed. The wavelength conversion substance may be formed in a portion of the light-guide member 60 or in the entirety of the light-guide member 60. The wavelength conversion substance may not be contained.

Figure 12C:
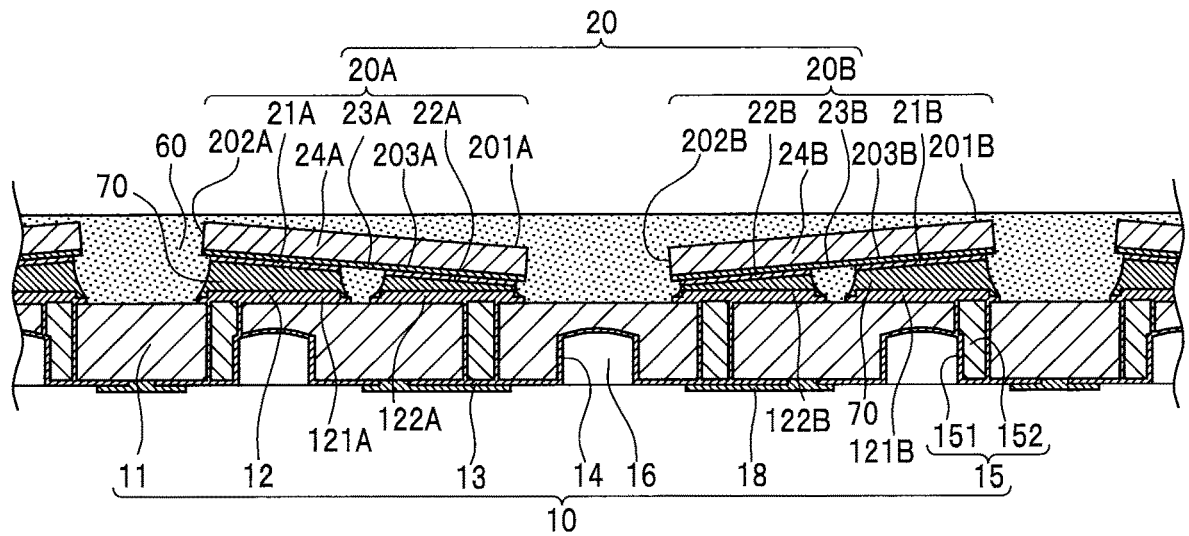
FIG. 12C is a schematic cross-sectional view for illustrating a step of removing the light-guide member in the method of manufacturing the light-emitting device according to the first embodiment of the present disclosure.

In Step S603 of removing the light-guide member, a portion of the light-guide member 60 that covers the first element light extracting surface 201A and the first element lateral surfaces 202A of the first light-emitting element 20A and the second element light extracting surface 201B and the second element lateral surfaces 202B of the second light-emitting element 20B is removed as shown in FIG. 12C. This step is performed to reduce the thickness of the light-guide member 60.

In this step, a known method such as grinding can be employed for removing a portion of the light-guide member 60.

Figure 12D:
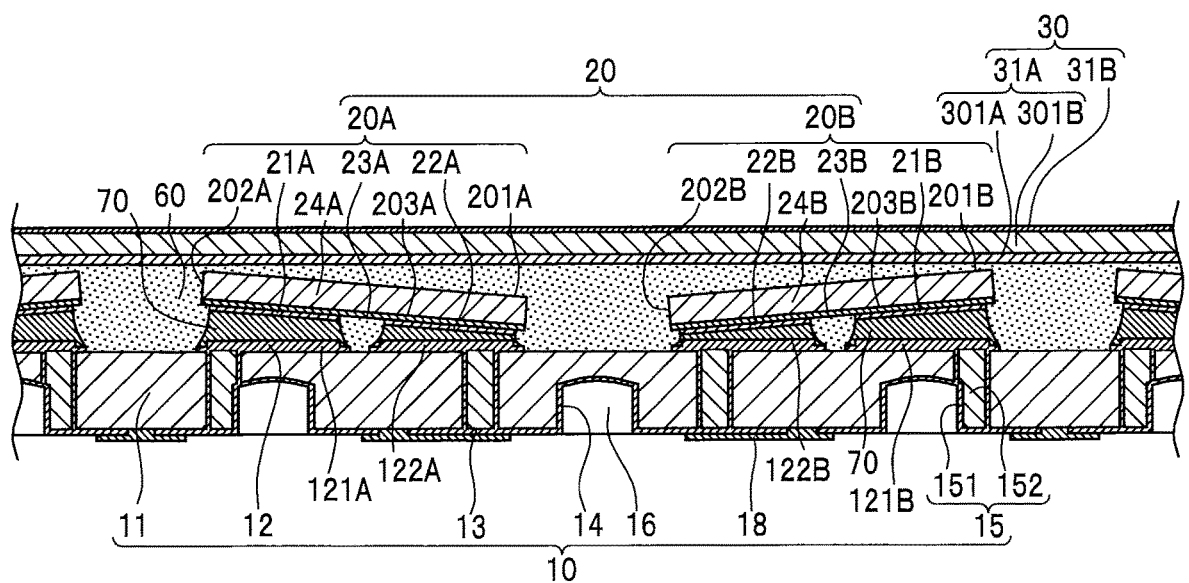
FIG. 12D is a schematic cross-sectional view for illustrating a step of forming a light-transmissive member in the method of manufacturing the light-emitting device according to the first embodiment of the present disclosure.

In Step S604 of forming a light-transmissive member, the light-transmissive member 30 that continuously covers the first element light extracting surface 201A of the first light-emitting element 20A and the second element light extracting surface 201B of the second light-emitting element 20B is formed such that the light-guide member 60 is disposed between the light-transmissive member 30 and each of the first element light extracting surface 201A and the second element light extracting surface 201B as shown in FIG. 12D.

In this step, the first wavelength conversion layer 301A is formed on the light-guide member 60, and the second wavelength conversion layer 301B is then formed on the first wavelength conversion layer 301A, so that the wavelength conversion layer 31A is formed. The first light-transmissive layer 31B is then formed on the second wavelength conversion layer 301B (on the wavelength conversion layer 31A).

In this step, a sheet-shaped wavelength conversion member is disposed on the light-guide member 60, so that the first wavelength conversion layer 301A is formed. Alternatively, a liquid resin material containing the base material and the wavelength conversion substance is applied over the light-guide member 60 using a dispenser or the like, and then the liquid resin material is cured by heating or the like. In this step, the second wavelength conversion layer 301B is formed by, for example, applying a liquid resin material containing the base material and the wavelength conversion substance over the first wavelength conversion layer 301A using a dispenser or the like, and then curing the liquid resin material by heat or the like. In this step, the first light-transmissive layer 31B is formed by, for example, applying a liquid resin material containing the base material and the first diffusing particles over the second wavelength conversion layer 301B using a dispenser or the like and then curing the liquid resin material by heat or the like. The viscosities and applied amounts of the liquid resin materials are appropriately adjusted such that the light-transmissive member 30 has the layered structure as shown in FIG. 12D.

Figure 12E:
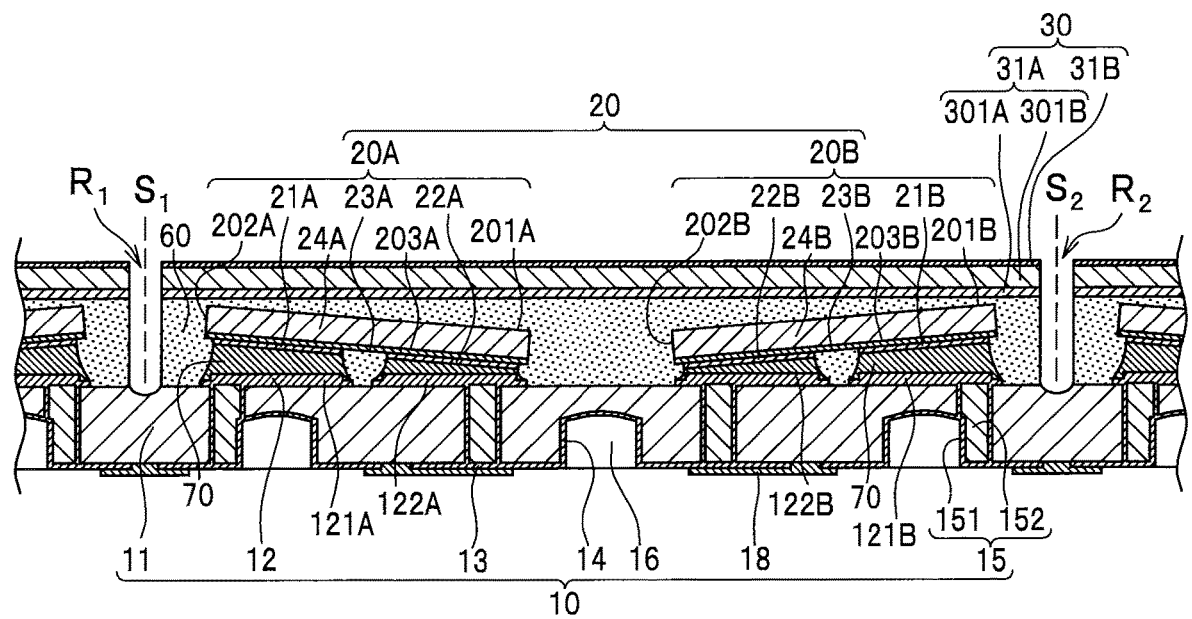
FIG. 12E is a schematic cross-sectional view for illustrating a step of forming grooves in the method of manufacturing the light-emitting device according to the first embodiment of the present disclosure.

In Step S605 of forming grooves, a groove $R_1$ and a groove $R_2$ are formed to extend through the light-transmissive member 30 and the light-guide member 60 and reach the support substrate 11, as shown in FIG. 12E.

In this step, the groove $R_1$ is formed by cutting the light-transmissive member 30 and the light-guide member 60 along a dashed line $S_1$ using a blade or laser. Also, the groove $R_2$ is formed by cutting the light-transmissive member 30 and the light-guide member 60 along a dashed line $S_2$ using a blade or laser.

Forming the groove $R_1$ and the groove $R_2$ allows the first reflective member 40 surrounding the first light-emitting element 20A, the second light-emitting element 20B, and the light-guide member 60 in a top view to be precisely manufactured in the subsequent step. The groove $R_1$ and the groove $R_2$ may have any appropriate shape, and may have, for example, a V-shape or a U-shape.

Figure 12F:
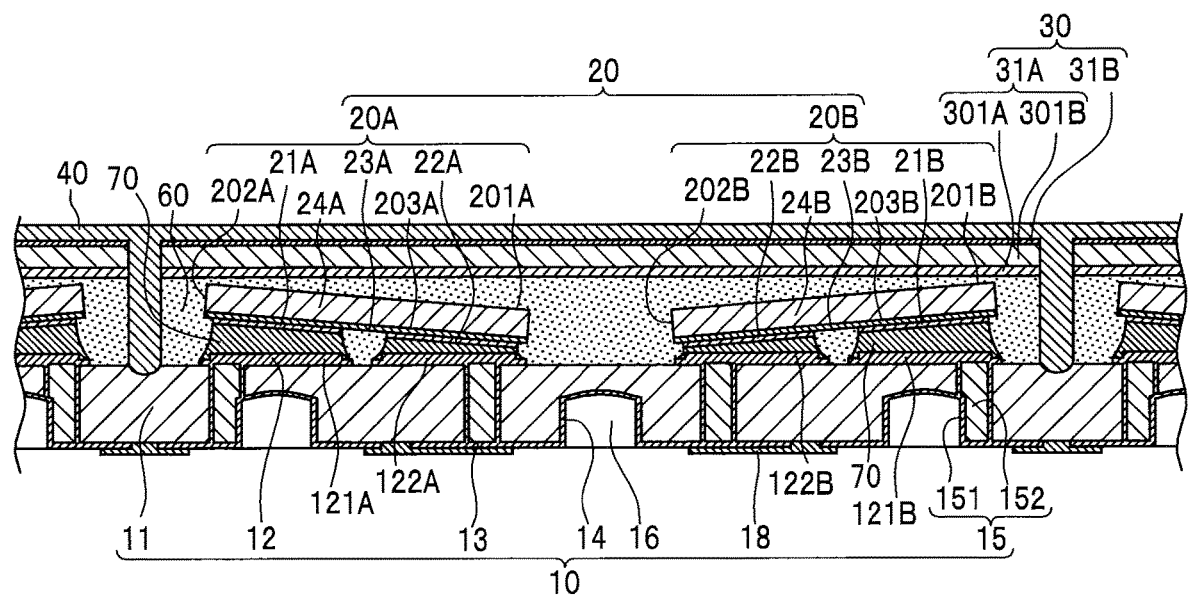
FIG. 12F is a schematic cross-sectional view for illustrating a step of forming a reflective member in the method of manufacturing the light-emitting device according to the first embodiment of the present disclosure.

In Step S606 of forming a reflective member, the first reflective member 40 is formed to surround the first light-emitting element 20A, the second light-emitting element 20B, and the light-guide member 60, as shown in FIG. 12F.

In this step, to form the first reflective member 40, for example, an uncured resin in which a light-reflective substance is dispersed is dropped onto the light-transmissive member 30 or filled into the groove $R_1$ and the groove $R_2$ by, for example, potting using a dispenser. Alternatively, the first reflective member 40 is formed inside the grooves and on the light-transmissive member 30 by printing or the like. After that, the uncured resin dropped onto the light-transmissive member 30 or filled into the groove $R_1$ and the groove $R_2$ is cured by heating at a predetermined temperature for a predetermined period of time with a heating device such as a heater.

Figure 12G:
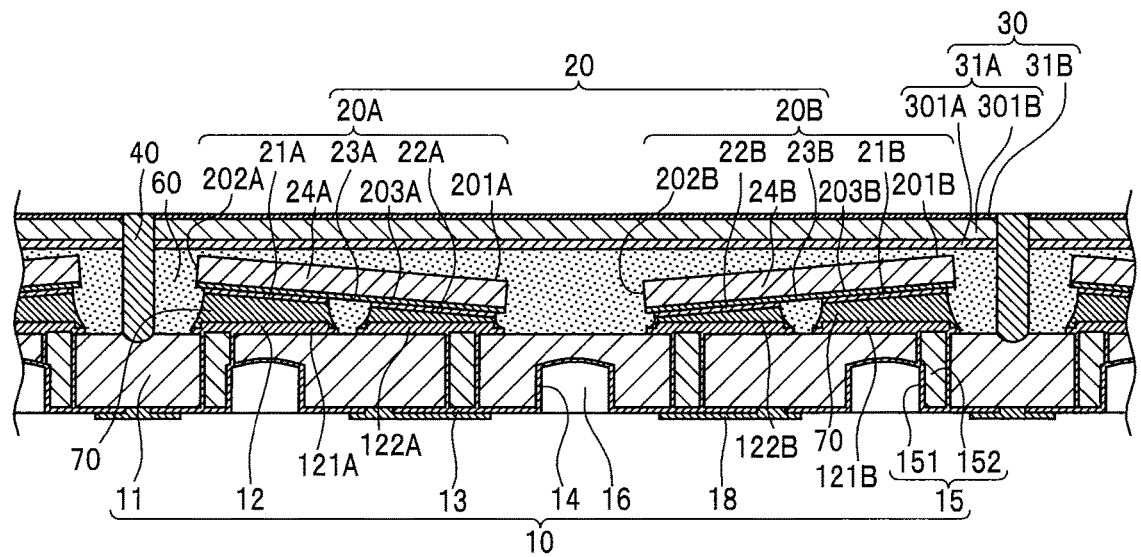
FIG. 12G is a schematic cross-sectional view for illustrating a step of removing the reflective member in the method of manufacturing the light-emitting device according to the first embodiment of the present disclosure.

In Step S607 of removing a portion of the reflective member, a portion of the first reflective member 40 that surrounds the first light-emitting element 20A, the second light-emitting element 20B, and the light-guide member 60 is removed as shown in FIG. 12G. This step is performed to remove a portion of the first reflective member 40 formed on the light-transmissive member 30.

In this step, for example, a portion of the first reflective member 40 is ground using a grindstone or a cutting blade. Alternatively, for example, the first reflective member 40 is polished using a grinder and a polisher. Accordingly, the first reflective member 40 covering the first element lateral surface 202A of the first light-emitting element 20A and the second element lateral surface 202B of the second light-emitting element 20B such that the light-guide member 60 is disposed between the first reflective member 40 and each of the first element lateral surface 202A and the second element lateral surface 202B and having a shape corresponding to the groove $R_1$ and the groove $R_2$ can be formed.

Figure 12H:
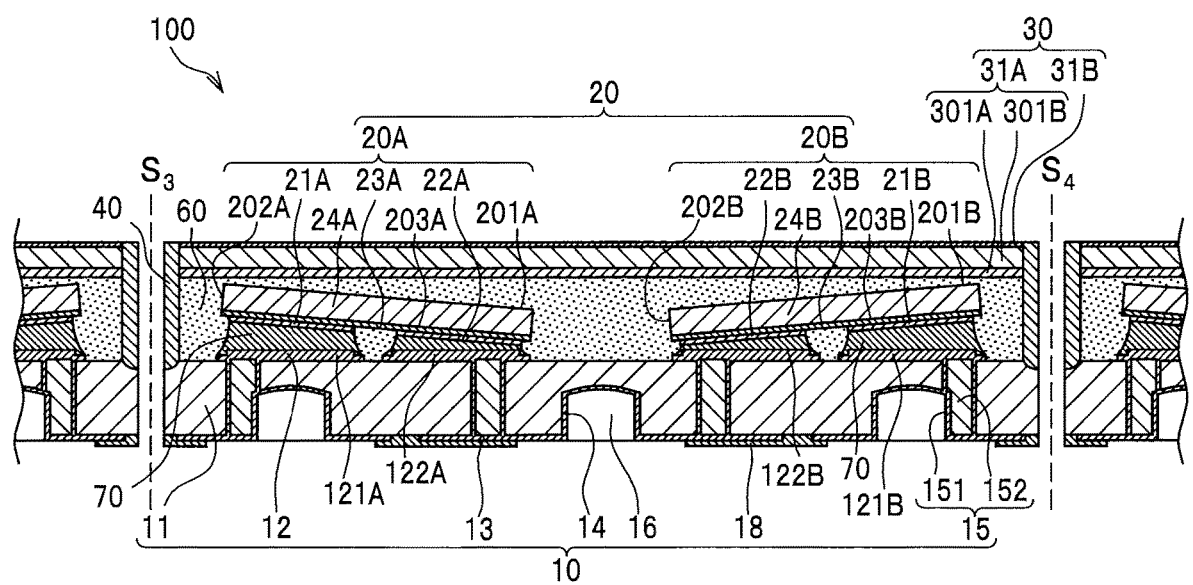
FIG. 12H is a schematic cross-sectional view for illustrating a step of singulating the light-emitting device in the method of manufacturing the light-emitting device according to the first embodiment of the present disclosure.

In Step S608 of singulating the light-emitting device, the light-emitting device 100 is singulated along a dashed line $S_3$ and a dashed line $S_4$ as shown in FIG. 12H.

In this step, the light-emitting device 100 is singulated by cutting the first reflective member 40 and the substrate 10 along the dashed line $S_3$ passing through the middle between adjacent light-emitting devices 100 and cutting the first reflective member 40 and the substrate 10 along the dashed line $S_4$ passing through the middle between adjacent light-emitting devices 100 by, for example, blade dicing or laser dicing. In this step, for example, the light-emitting device 100 is cut along the dashed line $S_3$ and the dashed line $S_4$, in other words, along each dividing groove at the center of the dividing groove, with a dicing saw with an edge thickness of 20 μm.

The light-emitting device 100 is manufactured through the steps as described above.

In the case where the second reflective member 80 is disposed as in the light-emitting device 100A shown in FIG. 3, a step of forming the second reflective member may be performed after Step S601 of mounting light-emitting elements and before Step S602 of forming a light-guide member.

The second reflective member 80 can be formed by, for example, transfer molding, injection molding, compression molding, or potting.

A portion of the second reflective member 80 may creep up on the lateral surfaces of the light-emitting elements. In this case, removing the second reflective member 80 on the lateral surfaces by blasting or the like or disposing the second reflective member 80 in two installments allows for reducing creeping up on the lateral surfaces of the light-emitting elements.

In the case where the third reflective member 50 is disposed, a step of forming the third reflective member may be performed between Step S601 of mounting light-emitting elements and Step S602 of forming a light-guide member.

The third reflective member 50 can be formed by, for example, transfer molding, injection molding, compression molding, or potting.

In the case where the second light-transmissive layer 31C is formed as in the light-emitting device 100B shown in FIG. 4, the second light-transmissive layer 31C is formed by, for example, applying a liquid resin material containing the base material and the second diffusing particles over the light-guide member 60 using a dispenser or the like and then curing the liquid resin material by heat or the like in Step S604 of forming a light-transmissive member. In the case where the second light-transmissive layer 31C is disposed, the wavelength conversion layer 31A may be composed of a single layer.

In the case where the covering member 31D is disposed as in the light-emitting device 100B shown in FIG. 4, a step of forming the covering member may be performed before Step S601 of mounting light-emitting elements, or between Step S601 of mounting light-emitting elements and Step S602 of forming a light-guide member.

The covering member 31D can be formed by, for example, transfer molding, injection molding, compression molding, or potting.

The steps are not necessarily performed in the order as described above. For example, the step of forming the second reflective member may be performed before Step S601 of mounting light-emitting elements. Step S601 of mounting light-emitting elements may be performed after the step of forming the third reflective member.

In Step S601 of mounting light-emitting elements in the method of manufacturing the light-emitting device, the active layer(s) of at least one of the first light-emitting element 20A and the second light-emitting element 20B is inclined relative to a surface on or above which the light-emitting elements are placed.

In the case where the third light-emitting element 20C is mounted, the third light-emitting element 20C (for example, a blue light-emitting element) is mounted on the substrate 10 in Step S601 of mounting light-emitting elements.

In the case where the third light-emitting element 20C is mounted, the active layer of the third light-emitting element 20C may be inclined relative to the surface on or above which the light-emitting element is placed, in Step S601 of mounting light-emitting elements.

In a top view, the second light-emitting element 20B may be disposed between the first light-emitting element 20A and the third light-emitting element 20C, and the active layer of the first light-emitting element 20A and the active layer of the third light-emitting element 20C may be inclined toward the center (second light-emitting element 20B side) of the light-emitting device 100 relative to a surface on or above which the light-emitting elements are placed.

In Step S602 of forming a light-guide member, the light-guide member 60 is formed to cover the first element light extracting surface 201A and the first element lateral surfaces 202A of the first light-emitting element 20A, the second element light extracting surface 201B and the second element lateral surfaces 202B of the second light-emitting element 20B, and the third element light extracting surface 201C and the third element lateral surfaces 202C of the third light-emitting element 20C.

In Step S604 of forming a light-transmissive member, the light-transmissive member 30 is formed to continuously cover the first element light extracting surface 201A of the first light-emitting element 20A, the second element light extracting surface 201B of the second light-emitting element 20B, and the third element light extracting surface 201C of the third light-emitting element 20C such that the light-guide member 60 is disposed between the light-transmissive member 30 and each of the first element light extracting surface 201A, the second element light extracting surface 201B, and the third element light extracting surface 201C.

While certain embodiments of the present invention are described above, the scope of the present invention is not limited to the description above, and should be broadly interpreted on the basis of the claims. Also, various modifications of description above is within the scope of the present invention.

The light-emitting device according to certain embodiments of the present disclosure can be used fora light-emitting device for a vehicle and the like.

What is claimed is:

1. A light-emitting device comprising:
a first light-emitting element including:
a first element light extracting surface,
a first element electrode formation surface opposite to the first element light extracting surface, and
first element lateral surfaces between the first element light extracting surface and the first element electrode formation surface;
a second light-emitting element having a peak emission wavelength different from a peak emission wavelength of the first light-emitting element and including:
a second element light extracting surface,
a second element electrode formation surface opposite to the second element light extracting surface, and
second element lateral surfaces between the second element light extracting surface and the second element electrode formation surface;
a light-guide member covering the first element light extracting surface, the first element lateral surfaces, the second element light extracting surface, and the second element lateral surfaces;
a wavelength conversion layer continuously covering the first element light extracting surface and the second element light extracting surface and disposed apart from the first light-emitting element and the second light-emitting element such that the light-guide member is disposed between the wavelength conversion layer and each of the first light-emitting element and the second light-emitting element;
a first reflective member covering outer lateral surfaces of the light-guide member; and
a substrate on or above which the first light-emitting element and the second light-emitting element are disposed;
a second reflective member continuously disposed between lower surfaces of the first light-emitting element and the second light-emitting element and an upper surface of the substrate,
wherein the first light-emitting element includes a first active layer having a surface closer to the wavelength conversion layer than to the first element electrode formation surface, and the second light-emitting element includes a second active layer having a surface closer to the wavelength conversion layer than to the second element electrode formation surface,
wherein the surface of the first active layer and the surface of the second active layer define an angle of less than 180°.

2. The light-emitting device according to claim 1, wherein the surface of the first active layer of the first light-emitting element and the surface of the second active layer of the second light-emitting element define an angle of 170° or greater and 179.8° or less.

3. The light-emitting device according to claim 1,
wherein the substrate has a first outer projection and a first inner projection that are connected to the first light-emitting element, and a second outer projection and a second inner projection that are connected to the second light-emitting element, and
wherein the first outer projection has a height greater than a height of the first inner projection, and/or the second outer projection has a height greater than a height of the second inner projection.

4. The light-emitting device according to claim 1, wherein the substrate includes a first outer projection connected to the first light-emitting element and/or a second outer projection connected to the second light-emitting element.

5. The light-emitting device according to claim 1,
wherein the first element electrode formation surface is provided with a first outer electrode and a first inner electrode,
wherein the second element electrode formation surface is provided with a second outer electrode and a second inner electrode, and
wherein a spacer is disposed between an upper surface of the substrate and a lower surface of at least one of the first outer electrode and the second outer electrode.

6. The light-emitting device according to claim 1,
wherein the first element electrode formation surface is provided with a first outer electrode and a first inner electrode,
wherein the second element electrode formation surface is provided with a second outer electrode and a second inner electrode,
wherein a plurality of spacers are disposed between a lower surface of each of the first outer electrode, the first inner electrode, the second outer electrode, and the second inner electrode and an upper surface of the substrate,
wherein the plurality of spacers include a first spacer between the lower surface of the first outer electrode and the upper surface of the substrate, a second spacer between the lower surface of the first inner electrode and the upper surface of the substrate, a third spacer between the lower surface of the second outer electrode and the upper surface of the substrate, and a fourth spacer between the lower surface of the second inner electrode and the upper surface of the substrate,
wherein a size of the first spacer between the lower surface of the first outer electrode and the upper surface of the substrate is larger than a size of the second spacer between the lower surface of the first inner electrode and the upper surface of the substrate, and/or a size of the third spacer between the lower surface of the second outer electrode and the upper surface of the substrate is larger than a size of the fourth spacer between the lower surface of the second inner electrode and the upper surface of the substrate.

7. The light-emitting device according to claim 1,
wherein the first element electrode formation surface is provided with a first outer electrode and a first inner electrode,
wherein the second element electrode formation surface is provided with a second outer electrode and a second inner electrode, and
wherein the first outer electrode has a height greater than a height of the first inner electrode, and/or the second outer electrode has a height greater than a height of the second inner electrode.

8. The light-emitting device according to claim 1, wherein an optical axis of the first light-emitting element intersects an optical axis of the second light-emitting element on a light-emitting surface side of the light-emitting device.

9. The light-emitting device according to claim 1,
wherein the peak emission wavelength of the first light-emitting element is 430 nm or greater and less than 490 nm, and
wherein the peak emission wavelength of the second light-emitting element is 490 nm or greater and less than 570 nm.

10. The light-emitting device according to claim 1,
wherein the wavelength conversion layer contains a wavelength conversion substance, and
wherein a peak emission wavelength of the wavelength conversion substance is 580 nm or greater and less than 680 nm.

11. The light-emitting device according to claim 1, wherein the first reflective member further covers outer lateral surfaces of the wavelength conversion layer.

12. A light-emitting device comprising:
a first light-emitting element including:
a first element light extracting surface,
a first element electrode formation surface opposite to the first element light extracting surface, and
first element lateral surfaces between the first element light extracting surface and the first element electrode formation surface;
a second light-emitting element having a peak emission wavelength different from a peak emission wavelength of the first light-emitting element and including:
a second element light extracting surface,
a second element electrode formation surface opposite to the second element light extracting surface, and
second element lateral surfaces between the second element light extracting surface and the second element electrode formation surface;
a light-guide member covering the first element light extracting surface, the first element lateral surfaces, the second element light extracting surface, and the second element lateral surfaces;
a wavelength conversion layer continuously covering the first element light extracting surface and the second element light extracting surface and disposed apart from the first light-emitting element and the second light-emitting element such that the light-guide member is disposed between the wavelength conversion layer and each of the first light-emitting element and the second light-emitting element;
a first reflective member covering outer lateral surfaces of the light-guide member,
a substrate on or above which the first light-emitting element and the second light-emitting element are disposed; and
a plurality of electrically-conductive adhesive members,
wherein the first element electrode formation surface is provided with a first outer electrode and a first inner electrode,
wherein the second element electrode formation surface is provided with a second outer electrode and a second inner electrode,
wherein each of the plurality of electrically-conductive adhesive members bonds a corresponding one of the first outer electrode, the first inner electrode, the second outer electrode, and the second inner electrode to the substrate, and wherein a portion of the electrically-conductive adhesive member bonded to the first outer electrode is located at a height greater than a height of a portion of the electrically-conductive adhesive member bonded to the first inner electrode, and/or a portion of the electrically-conductive adhesive member bonded to the second outer electrode is located at a height greater than a height of a portion of the electrically-conductive adhesive member bonded to the second inner electrode, wherein the first light-emitting element includes a first active layer having a surface closer to the wavelength conversion layer than to the first element electrode formation surface, and the second light-emitting element includes a second active layer having a surface closer to the wavelength conversion layer than to the second element electrode formation surface, wherein the surface of the first active layer and the surface of the second active layer define an angle of less than 180°.

13. The light-emitting device according to claim 12, wherein the surface of the first active layer of the first light-emitting element and the surface of the second active layer of the second light-emitting element define an angle of 170° or greater and 179.8° or less.

14. The light-emitting device according to claim 12, wherein an optical axis of the first light-emitting element intersects an optical axis of the second light-emitting element on a light-emitting surface side of the light-emitting device.

15. The light-emitting device according to claim 12,
wherein the peak emission wavelength of the first light-emitting element is 430 nm or greater and less than 490 nm, and
wherein the peak emission wavelength of the second light-emitting element is 490 nm or greater and less than 570 nm.

16. The light-emitting device according to claim 12,
wherein the wavelength conversion layer contains a wavelength conversion substance, and
wherein a peak emission wavelength of the wavelength conversion substance is 580 nm or greater and less than 680 nm.

17. The light-emitting device according to claim 12, wherein the first reflective member further covers outer lateral surfaces of the wavelength conversion layer.

18. A light-emitting device comprising:
a first light-emitting element including:
a first element light extracting surface,
a first element electrode formation surface opposite to the first element light extracting surface, and
first element lateral surfaces between the first element light extracting surface and the first element electrode formation surface;
a second light-emitting element having a peak emission wavelength different from a peak emission wavelength of the first light-emitting element and including:
a second element light extracting surface,
a second element electrode formation surface opposite to the second element light extracting surface, and
second element lateral surfaces between the second element light extracting surface and the second element electrode formation surface and;

a light-guide member covering the first element light extracting surface, the first element lateral surfaces, the second element light extracting surface, and the second element lateral surfaces;
a wavelength conversion layer continuously covering the first element light extracting surface and the second element light extracting surface and disposed apart from the first light-emitting element and the second light-emitting element such that the light-guide member is disposed between the wavelength conversion layer and each of the first light-emitting element and the second light-emitting element;
a first reflective member covering outer lateral surfaces of the light-guide member; and
a substrate on or above which the first light-emitting element and the second light-emitting element are disposed,
wherein the first element electrode formation surface is provided with a first outer electrode and a first inner electrode,
wherein the second element electrode formation surface is provided with a second outer electrode and a second inner electrode,
wherein a plurality of spacers are disposed between a lower surface of each of the first outer electrode, the first inner electrode, the second outer electrode, and the second inner electrode and an upper surface of the substrate,
wherein the plurality of spacers include a first spacer between the lower surface of the first outer electrode and the upper surface of the substrate, a second spacer between the lower surface of the first inner electrode and the upper surface of the substrate, a third spacer between the lower surface of the second outer electrode and the upper surface of the substrate, and a fourth spacer between the lower surface of the second inner electrode and the upper surface of the substrate,
wherein a size of the first spacer between the lower surface of the first outer electrode and the upper surface of the substrate is larger than a size of the second spacer between the lower surface of the first inner electrode and the upper surface of the substrate, and/or a size of the third spacer between the lower surface of the second outer electrode and the upper surface of the substrate is larger than a size of the fourth spacer between the lower surface of the second inner electrode and the upper surface of the substrate,
wherein the first light-emitting element includes a first active layer having a surface closer to the wavelength conversion layer than to the first element electrode formation surface, and the second light-emitting element includes a second active layer having a surface closer to the wavelength conversion layer than to the second element electrode formation surface,
wherein the surface of the first active layer and the surface of the second active layer define an angle of less than 180°.

19. The light-emitting device according to claim 18, wherein the surface of the first active layer of the first light-emitting element and the surface of the second active layer of the second light-emitting element define an angle of 170° or greater and 179.8° or less.

20. The light-emitting device according to claim 18, wherein an optical axis of the first light-emitting element intersects an optical axis of the second light-emitting element on a light-emitting surface side of the light-emitting device.

\* \* \* \* \*